US012563881B2

(12) United States Patent 
Yeo et al.

(10) Patent No.: US 12,563,881 B2 
(45) Date of Patent: Feb. 24, 2026

(54) DISPLAY DEVICE AND METHOD FOR MANUFACTURING THE SAME

(71) Applicant: Samsung Display Co., LTD., Yongin-si (KR)

(72) Inventors: So Young Yeo, Yongin-si (KR); Soo Chul Kim, Yongin-si (KR); Jin Taek Park, Yongin-si (KR); Dae Ho Song, Yongin-si (KR); Eok Yi Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 437 days.

(21) Appl. No.: 18/182,113

(22) Filed: Mar. 10, 2023

(65) Prior Publication Data

US 2024/0021660 A1     Jan. 18, 2024

(30) Foreign Application Priority Data

Jul. 12, 2022     (KR) ........................ 10-2022-0085406

(51) Int. Cl. 
*H10H 29/14*          (2025.01)

(52) U.S. Cl. 
CPC ................................. *H10H 29/142* (2025.01)

(58) Field of Classification Search 
CPC .............. H10H 29/142; H10H 20/857; H10H 20/0364; H10H 20/855; H10H 20/85; H10H 20/036; H10H 20/018; H10H 20/032; H10H 20/0361; H10H 20/835; H10H 20/8506; H10H 20/8513; H10H 20/882; H01L 25/167; H01L 25/0753; H10D 86/021; H10D 86/441; H10D 86/60; H10D 86/451 
See application file for complete search history.

(56) References Cited

U.S. PATENT DOCUMENTS

| | | | |
|---|---|---|---|
| 7,565,996 B2 | 7/2009 | Das | |
| 11,092,910 B2 * | 8/2021 | Kamata | ................ H10H 20/813 |

(Continued)

FOREIGN PATENT DOCUMENTS

| | | |
|---|---|---|
| KR | 10-2016-0028774 A | 3/2016 |
| KR | 10-2018-0118488 A | 10/2018 |
| KR | 10-2020-0022575 A | 3/2020 |

OTHER PUBLICATIONS

Hilton, A., et al., "Wafer-Level Vacuum Packaging of Smart Sensors," Sensors 2016, 16, 1819; doi: 10.3390/s16111819, www.mdpi.com/journal/sensors, Oct. 31, 2016, 33 pages.

*Primary Examiner* — Victor A Mandala 
(74) *Attorney, Agent, or Firm* — Womble Bond Dickinson (US) LLP

(57)          ABSTRACT

A display device includes: a circuit board including a plurality of pixel drivers respectively corresponding to a plurality of emission areas; a plurality of pixel electrodes on the circuit board and respectively corresponding to the plurality of emission areas; a plurality of pixel connection electrodes respectively on the plurality of pixel electrodes, each of the plurality of pixel connection electrodes including: a main layer on each of the plurality of pixel electrodes; and a sub-layer surrounding a part of a side surface of the main layer adjacent to a top surface of the main layer and including a material different from a material of the main layer; and a plurality of light emitting elements respectively on the plurality of pixel connection electrodes.

12 Claims, 36 Drawing Sheets

(56) References Cited

U.S. PATENT DOCUMENTS

| | | | |
|---|---|---|---|
| 2017/0345802 A1* | 11/2017 | Sung | H10H 20/8515 |
| 2021/0288222 A1* | 9/2021 | Young | H10H 20/835 |
| 2022/0006040 A1* | 1/2022 | Arakawa | H05B 33/10 |
| 2022/0384395 A1* | 12/2022 | Tan | H10H 20/0137 |
| 2022/0384516 A1* | 12/2022 | Tan | H01L 25/18 |
| 2023/0005887 A1* | 1/2023 | Kwon | H01L 25/0753 |
| 2024/0040845 A1* | 2/2024 | Yang | H10K 59/1201 |
| 2024/0065036 A1* | 2/2024 | Yamazaki | G09F 9/00 |
| 2024/0065054 A1* | 2/2024 | Yamazaki | H10K 71/60 |
| 2024/0306466 A1* | 9/2024 | Yamazaki | G02B 5/20 |

* cited by examiner

EA: EA1, EA2, EA3
LCL: LCP1, LCP2, TP
CF: CFP1, CFP2, CFP3, LBP

EA: EA1, EA2, EA3
LCL: LCP1, LCP2, TP
CF: CFP1, CFP2, CFP3, LBP

DR3

DR2 ⊙ → DR1

EA: EA1, EA2, EA3
LCL: LCP1, LCP2, TP
CF: CFP1, CFP2, CFP3, LBP

EA: EA1, EA2, EA3

EA: EA1, EA2, EA3

EA: EA1, EA2, EA3

EA: EA1, EA2, EA3

EA: EA1, EA2, EA3

EA: EA1, EA2, EA3

EA: EA1, EA2, EA3

EA: EA1, EA2, EA3
MST: BLC1, BLC2, OP

EA: EA1, EA2, EA3
MST: BLC1, BLC2, OP

EA: EA1, EA2, EA3

EA: EA1, EA2, EA3

EA: EA1, EA2, EA3

EA: EA1, EA2, EA3

EA: EA1, EA2, EA3

EA: EA1, EA2, EA3
LCL: LCP1, LCP2, TP

EA: EA1, EA2, EA3
LCL: LCP1, LCP2, TP

DISPLAY DEVICE AND METHOD FOR MANUFACTURING THE SAME

CROSS-REFERENCE TO RELATED APPLICATION

This application claims priority to and the benefit of Korean Patent Application No. 10-2022-0085406, filed on Jul. 12, 2022, in the Korean Intellectual Property Office, the entire content of which is herein incorporated by reference.

BACKGROUND

1. Field

Aspects of embodiments of the present disclosure relate to a display device and a method for manufacturing the same.

2. Description of the Related Art

With the advance of an information-oriented society, demand for display devices that display images in various ways is increasing. For example, the display device may be provided in the form of a flat panel that can be applied to various electronic devices, such as a smart phone, a digital camera, a laptop computer, a navigation system, and a smart television. A flat panel display device may include a liquid crystal display, a field emission display, and a light emitting display.

A light emitting display device may include an organic light emitting diode display device including an organic light emitting diode element, an inorganic light emitting display device including an inorganic semiconductor device, a micro light emitting diode display device including an ultra-small light emitting diode element (or a micro light emitting diode element), and the like depending on light emitting elements emitting light.

SUMMARY

A display device, according to embodiments of the present disclosure, includes a pixel connection electrode that fixes a light emitting element on a pixel electrode and electrically connects the pixel electrode to the light emitting element. The pixel connection electrode may be formed of an intermetallic compound (IMC) alloy in which a metallic material having a relatively low melting point is infiltrated, in a molten state, into a metallic material having a relatively high melting point.

However, when preparing the IMC alloy, because a mixing ratio between the metallic material having a relatively low melting point and the metallic material having a relatively high melting point is different, it is difficult for the IMC alloy to be formed with uniform properties. Further, due to the different etching rates for each part of the IMC alloy, a patterning process of the IMC alloy to provide a plurality of pixel connection electrodes respectively corresponding to a plurality of emission areas is difficult and process errors may frequently occur.

In addition, to reliability secure bonding between the pixel electrode and the light emitting element, the pixel connection electrode made of the IMC alloy should have a thickness greater than or equal to a threshold thickness. Accordingly, it is difficult to reduce the process difficulty of the step of preparing the plurality of pixel connection electrodes.

Embodiments of the present disclosure provide a display device with reduced process difficulty of a step of preparing a plurality of pixel connection electrodes and improved luminance, and embodiments of the present disclosure also provide a method for manufacturing such a display device.

According to an embodiment, a display device includes: a circuit board including a plurality of pixel drivers respectively corresponding to a plurality of emission areas; a plurality of pixel electrodes on the circuit board and respectively corresponding to the plurality of emission areas; a plurality of pixel connection electrodes respectively on the plurality of pixel electrodes; and a plurality of light emitting elements respectively on the plurality of pixel connection electrodes. Each of the plurality of pixel connection electrodes includes a main layer on each of the plurality of pixel electrodes and a sub-layer surrounding a part of a side surface of the main layer adjacent to a top surface of the main layer and including a material different from a material of the main layer.

A pixel connection electrode of the plurality of pixel connection electrodes may be between one of the pixel electrodes from among the plurality of pixel electrodes and one of the light emitting elements from among the plurality of light emitting elements. A width of the main layer of the pixel connection electrode may correspond to a width of the pixel electrode. A width of the sub-layer of the pixel connection electrode may correspond to a width of the light emitting element.

The width of the light emitting element may be greater than the width of the pixel electrode.

The main layer may include an alloy of a first metallic material and a second metallic material. The second metallic material may have a lower melting point than the first metallic material. The sub-layer may include the first metallic material.

The first metallic material may be one of gold (Au), silver (Ag), and copper (Cu), and the second metallic material may be tin (Sn).

Each of the plurality of pixel connection electrodes may further include a first barrier layer between the main layer and each of the plurality of pixel electrodes and a second barrier layer between the main layer and the sub-layer.

Each of the first barrier layer and the second barrier layer may include titanium (Ti).

The circuit board may include: a first interlayer insulating layer covering the plurality of pixel drivers; a plurality of pixel extension electrodes on the first interlayer insulating layer and the plurality of pixel extension electrodes electrically connected to the plurality of pixel drivers, respectively; and a second interlayer insulating layer covering the plurality of pixel extension electrodes. The plurality of pixel electrodes may be on the second interlayer insulating layer, and the plurality of pixel electrodes may be electrically connected to the plurality of pixel extension electrodes, respectively.

The display device may further include a first insulating layer on the circuit board and corresponding to a separation region between the plurality of pixel electrodes, a barrier wall on the first insulating layer, corresponding to a non-emission area that is a separation region between the plurality of emission areas, and spaced apart from the plurality of light emitting elements; a second insulating layer covering a side surface of each of the plurality of light emitting elements and a side surface of the barrier wall; and a common electrode on the circuit board and covering the plurality of light emitting elements, the barrier wall, and the second insulating layer.

The display device may further include a reflective layer covering a part of the common electrode corresponding to the side surface of each of the plurality of light emitting elements and the side surface of the barrier wall.

The display device may further include: a light control layer on the common electrode and including a plurality of light control patterns, each of the plurality of light control patterns being surrounded by the barrier wall, corresponding to each of the plurality of emission areas, and configured to change characteristic of light emitted from each of the plurality of light emitting elements; a third insulating layer on the light control layer and the common electrode; and a color filter on the third insulating layer.

The barrier wall may include a first wall layer on the first insulating layer and being the same layer as the plurality of pixel connection electrodes, a second wall layer on the first wall layer and being the same layer as the plurality of light emitting elements, a third wall layer on the second wall layer and including a semiconductor material, and a fourth wall layer on the third wall layer and including a mask material.

According to an embodiment, a method for manufacturing a display device includes: preparing a circuit board including a plurality of pixel drivers respectively corresponding to a plurality of emission areas; disposing a plurality of pixel electrodes respectively corresponding to the plurality of emission areas on the circuit board; disposing a plurality of pixel bonding main material layers on the plurality of pixel electrodes, respectively, each of the plurality of pixel bonding main material layers including a stacked structure of a first metallic material and a second metallic material, the second metallic material having a lower melting point than the first metallic material; preparing a semiconductor substrate including a semiconductor structure on one surface of a sacrificial substrate; disposing a bonding sub-material layer including the first metallic material on the semiconductor structure of the semiconductor substrate; aligning the circuit board and the semiconductor substrate such that the second metallic material of each of the plurality of pixel bonding main material layers and the first metallic material of the bonding sub-material layer face each other; disposing a plurality of main layers on the plurality of pixel electrodes, respectively, by bonding the bonding sub-material layer to the plurality of pixel bonding main material layers, each of the plurality of main layers including an alloy of the first metallic material and the second metallic material; removing the sacrificial substrate from the semiconductor structure; and preparing a plurality of pixel connection electrodes and a plurality of light emitting elements by patterning the semiconductor structure and at least a part of a residue of the bonding sub-material layer remaining between the plurality of main layers, the plurality of pixel connection electrodes including at least the plurality of main layers, the plurality of light emitting elements being respectively on the plurality of pixel connection electrodes and respectively corresponding to the plurality of emission areas.

In the preparing the plurality of pixel connection electrodes and the plurality of light emitting elements, a plurality of sub-layers may be prepared by removing a part of the residue of the bonding sub-material layer, the plurality of sub-layers including the other remaining part of the residue of the bonding sub-material layer, each of the plurality of sub-layers surrounding a part of a side surface of each of the plurality of main layers that is adjacent to top surface of each of the plurality of main layers. A pixel connection electrode of the plurality of pixel connection electrodes may include a main layer of the plurality of main layers and a sub-layer of the plurality of sub-layers.

In each of the disposing the plurality of pixel bonding main material layers and the disposing the bonding sub-material layer, the first metallic material may be one of gold (Au), silver (Ag), and copper (Cu), and the second metallic material may be tin (Sn).

In the preparing the circuit board, the circuit board may include a first interlayer insulating layer covering the plurality of pixel drivers, a plurality of pixel extension electrodes on the first interlayer insulating layer and the plurality of pixel extension electrodes electrically connected to the plurality of pixel drivers, respectively, and a second interlayer insulating layer covering the plurality of pixel extension electrodes. The plurality of pixel electrodes may be on the second interlayer insulating layer, and the plurality of pixel electrodes may be electrically connected to the plurality of pixel extension electrodes, respectively.

The method may further include, after the disposing the plurality of pixel electrodes, disposing a first insulating layer corresponding to a separation region between the plurality of pixel electrodes on the circuit board. The disposing the plurality of pixel bonding main material layers may include disposing a mask layer on a part of the first insulating layer, sequentially stacking a first metallic material and a second metallic material on the plurality of pixel electrodes and the mask layer, and removing a part of the first metallic material on the mask layer and a part of the second metallic material on the mask layer while leaving remaining parts of the first metallic material on the plurality of pixel electrodes and remaining parts of the second metallic material on the plurality of pixel electrodes to prepare a plurality of pixel bonding main material layers by separating the mask layer from the first insulating layer. The plurality of pixel bonding main material layers may include the remaining parts of the first metallic material and the remaining parts of the second metallic material.

In the preparing the plurality of pixel connection electrodes and the plurality of light emitting elements, a barrier wall may be further provided. The barrier wall may be on the first insulating layer, correspond to a non-emission region that is a separation region between the plurality of emission areas, and spaced apart from the plurality of light emitting elements. The method may further include, after the preparing the plurality of pixel connection electrodes and the plurality of light emitting elements, disposing a second insulating layer covering a side surface of each of the plurality of light emitting elements and a side surface of the barrier wall and disposing a common electrode covering the plurality of light emitting elements, the barrier wall, the second insulating layer, and the first insulating layer on the circuit board.

The method may further include disposing a reflective layer covering a part of the common electrode corresponding to the side surface of each of the plurality of light emitting elements and the side surface of the barrier wall.

The method may further include disposing a light control layer on the common electrode, the light control layer including a plurality of light control patterns each of which is surrounded by the barrier wall, corresponds to each of the plurality of emission areas, and is configured to change characteristic of light emitted from each of the plurality of light emitting elements, disposing a third insulating layer on the light control layer and the common electrode, and disposing a color filter on the third insulating layer.

In the disposing the mask layer, the mask layer may have a plurality of first opening regions corresponding to the plurality of pixel electrodes, respectively, and a second opening region corresponding to the non-emission area and spaced apart from the plurality of first opening regions. In the providing the plurality of pixel bonding main material layers, the plurality of pixel bonding main material layers may be provided by a first metallic material and a second metallic material corresponding to the plurality of first opening regions, and a peripheral bonding main material layer may be further provided by a first metallic material and a second metallic material corresponding to the second opening region. In the disposing the plurality of main layers, the main layer of the first wall layer may be provided by bonding the peripheral bonding main material layer to the bonding sub-material layer.

In the preparing the plurality of pixel connection electrodes and the plurality of light emitting elements, each of the plurality of light emitting elements may include a first semiconductor layer on each of the plurality of pixel connection electrodes and made of a semiconductor material doped with a dopant of a first conductivity type, an active layer on the first semiconductor layer, and a second semiconductor layer on the active layer and made of a semiconductor material doped with a dopant of a second conductivity type different from the first conductivity type. In the preparing the semiconductor substrate, the semiconductor structure may include a third semiconductor layer on one surface of the sacrificial substrate and made of an undoped semiconductor material, and the second semiconductor layer, the active layer and the first semiconductor layer may be sequentially stacked on the third semiconductor layer. In the disposing the bonding sub-material layer, the bonding sub-material layer may be on the first semiconductor layer of the semiconductor structure. In the removing the sacrificial substrate, the third semiconductor layer of the semiconductor structure may be exposed.

The preparing the plurality of pixel connection electrodes and the plurality of light emitting elements may include disposing a mask structure on the third semiconductor layer of the semiconductor structure, the mask structure including a plurality of first blocking portions corresponding to the plurality of emission areas and including a first mask material layer, a second blocking portion corresponding to the non-emission area and including a stacked structure of a second mask material layer and the first mask material layer with an opening in a separation region between each of the plurality of first blocking portions and the second blocking portion. The second mask material layer may include a material different from a material of the first mask material layer and may provide a plurality of pattern layers, a plurality of pixel connection electrodes, a second wall layer, and a third wall layer by removing a part of each of the residue of the bonding sub-material layer and the semiconductor structure corresponding to the opening of the mask structure. The plurality of pattern layers may respectively include the semiconductor structure corresponding to the plurality of first blocking portions, the plurality of pixel connection electrodes respectively below the plurality of pattern layers, and the second wall layer and the third wall layer may include including the semiconductor structure corresponding to the second blocking portion. The method may further include removing the first mask material layer to expose the plurality of pattern layers corresponding to the plurality of first blocking portions, providing a fourth wall layer including the second mask material layer of the second blocking portion, and removing at least a part of the third semiconductor layer of each of the plurality of pattern layers to provide the plurality of light emitting elements. The barrier wall may include the first wall layer, the second wall layer, the third wall layer, and the fourth wall layer.

The disposing the plurality of main layers may include applying heat and pressure corresponding to a melting point of the second metallic material to the first and second metallic materials to couple the molten second metallic material with the first metallic material.

In the disposing the plurality of pixel bonding main material layers, each of the plurality of pixel bonding main material layers may further include a first barrier layer between each of the plurality of pixel electrodes and the first metallic material. In the disposing the bonding sub-material layer, the bonding sub-material layer may further include a second barrier layer between the semiconductor structure and the first metallic material.

Each of the first barrier layer and the second barrier layer may include titanium (Ti).

A display device, according to embodiments, includes a plurality of pixel electrodes respectively corresponding to a plurality of emission areas, a plurality of pixel connection electrodes respectively on the plurality of pixel electrodes, and a plurality of light emitting elements respectively on the plurality of pixel connection electrodes. Each of the plurality of pixel connection electrodes includes a main layer on each of the plurality of pixel electrodes and a sub-layer surrounding a part of the side surface of the main layer that contacts the top surface of the main layer and made of a material different from that of the main layer.

The main layer may be made of an alloy of a first metallic material and a second metallic material having a melting point lower than that of the first metallic material, and the sub-layer may be made of the first metallic material.

Accordingly, the main layer of each of the plurality of pixel connection electrodes may be provided by IMC alloying of the first metallic material and the second metallic material on each of the plurality of pixel electrodes, and then, the first metallic material remaining around the main layers of the plurality of pixel connection electrodes may be separated to respectively correspond to the plurality of emission areas thereby providing the sub-layer of each of the plurality of pixel connection electrodes. Through this process, the plurality of pixel connection electrodes, each including the main layer made of an IMC alloy of the first metallic material and the second metallic material, may be provided.

As such, because the main layer of each of the plurality of pixel connection electrodes is made of the first metallic material and the second metallic material on each of the plurality of pixel electrodes, a step of patterning the IMC alloy may be omitted. For example, the plurality of pixel connection electrodes may be provided through a process of separating only the first metallic material rather than separating the IMC alloy.

Accordingly, the process difficulty of the step of preparing the plurality of pixel connection electrodes may be reduced.

In addition, the main layer of each of the plurality of pixel connection electrodes may be on each of the plurality of pixel electrodes while each of the plurality of light emitting elements is on the main layer and the sub-layer of each of the plurality of pixel connection electrodes. Therefore, each of the plurality of light emitting elements may have a width greater than that of each of the plurality of pixel connection electrodes.

Thus, the width of the light emitting element is not limited to the width of the pixel electrode, and the luminance of the display device may be improved.

Aspects and features of the present disclosure are not limited to the aforementioned aspects and features, and various other aspects and features are included in the present specification.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
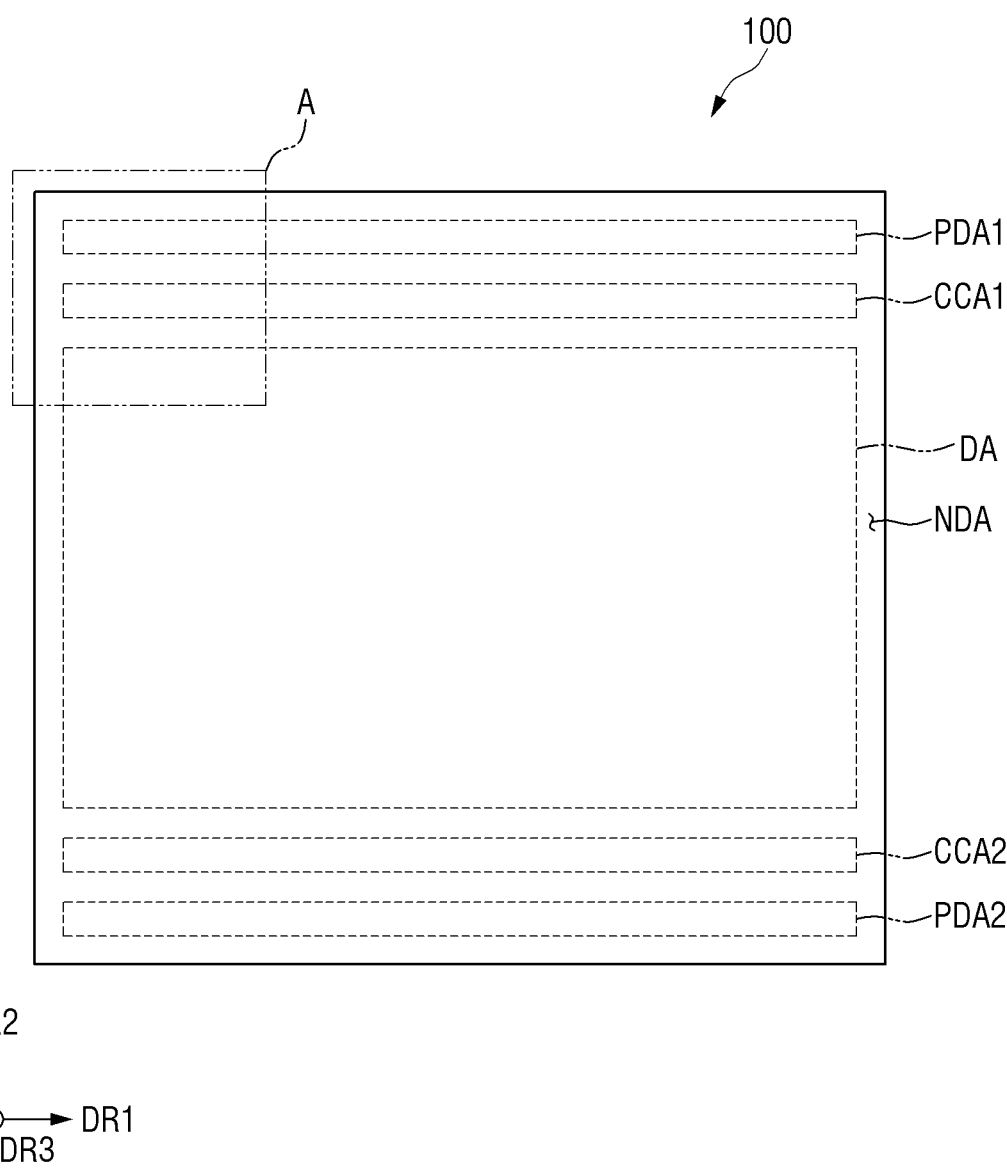
FIG. 1 is a plan view illustrating a display device according to one embodiment.

The embodiments will now be described more fully hereinafter with reference to the accompanying drawings. The embodiments may, however, be provided in different forms and should not be construed as limiting. Some of the parts, aspects, and features that are not associated with the description and/or are well known to those of ordinary skill in the relevant art may be omitted for ease of describing aspects and features of embodiments of the present disclosure.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

As used herein, the phrase "in a plan view" means when an object portion is viewed from above, and the phrase "in a schematic cross-sectional view" means when a schematic cross-section taken by vertically cutting an object portion and viewing it from the side. The terms "overlap" or "overlapped" mean that a first object may be above or below or to a side of a second object. Additionally, the term "overlap" may include layering, stacking, facing, extending over, covering, or partly covering, or any other suitable term as would be appreciated and understood by those of ordinary skill in the art. The expression "not overlap" may include meanings such as "apart from," "set aside from," or "offset from" and any other suitable terms as would be appreciated and understood by those of ordinary skill in the art. The terms "face" and "facing" may mean that a first object may directly or indirectly oppose a second object. When a third object is present between a first object and a second object, the first and second objects may be understood as being indirectly opposed to one another although still facing each other.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the present disclosure will be described with reference to the accompanying drawings.

Figure 2:
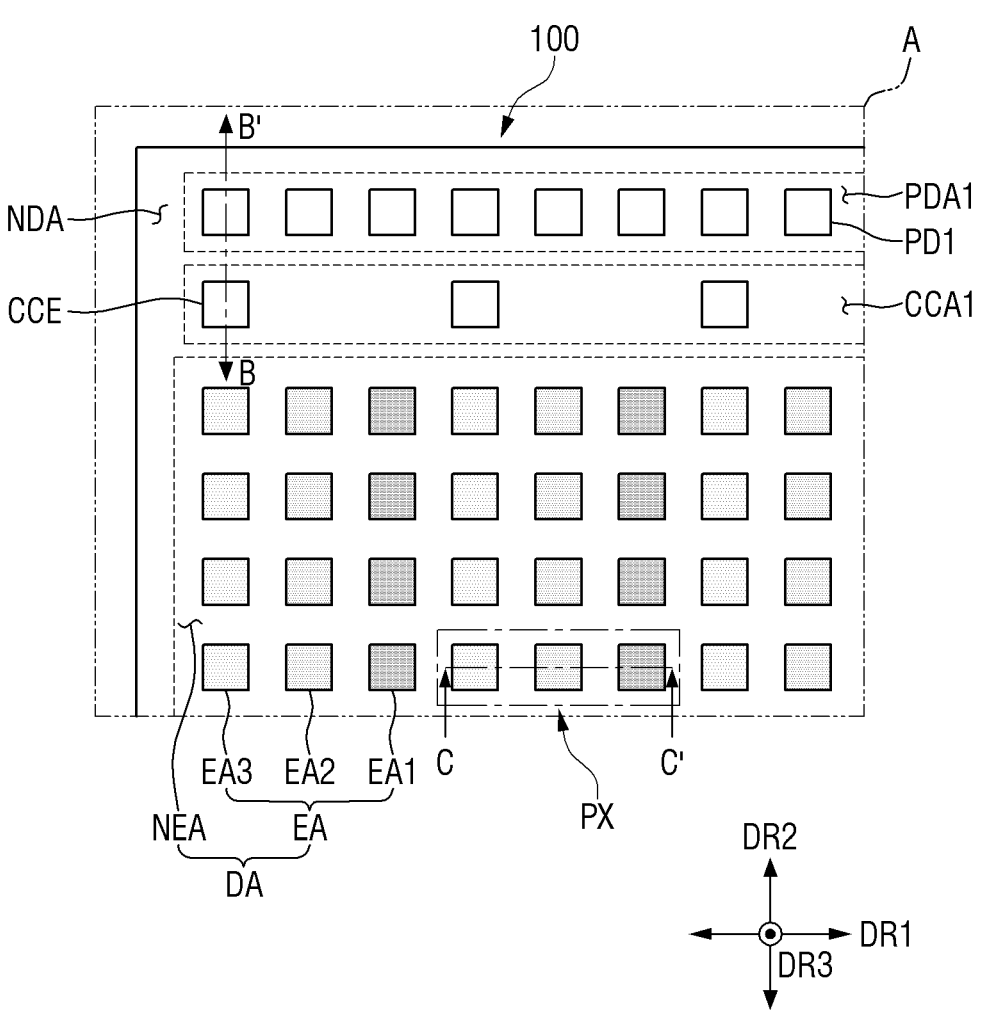
FIG. 2 is an expanded view of the portion A of FIG. 1.

FIG. 1 is a plan view illustrating a display device according to one embodiment, and FIG. 2 is a diagram illustrating the portion A of FIG. 1 in more detail.

In the present disclosure, the display device according to one embodiment is primarily described as a subminiature light emitting diode display device (e.g., a micro or nano light emitting diode display device) including a subminiature light emitting diode (e.g., a micro or nano light emitting diode), but the present disclosure is not limited thereto.

Similarly, although the display device according to one embodiment is primarily described as including a light emitting diode on silicon (LEDoS) substrate, in which light emitting diodes are disposed as light emitting elements on a circuit board 110 formed by a semiconductor process using a silicon wafer, it should be understood that the present disclosure is not limited thereto.

In addition, herein, a first direction DR1 indicates a horizontal direction along the display surface of the display device 100, a second direction DR2 indicates a vertical direction along the display surface of the display device 100, and a third direction DR3 indicates a thickness direction of the display device 100 or a thickness direction of the circuit board 110. Herein, "left," "right," "upper," and "lower" indicate directions when the display surface of the display device 100 is viewed from above (e.g., in a plan view). For example, "right side" indicates one side in the first direction DR1, "left side" indicates the other side in the first direction DR1, "upper side" indicates one side in the second direction DR2, and "lower side" indicates the other side in the second direction DR2. Further, "upper portion" or "upper surface" indicates one side in the third direction DR3, and "lower portion" or "lower surface" indicates the other side in the third direction DR3.

Referring to FIG. 1, the display device 100 according to one embodiment may have a flat panel shape.

For example, the display device 100 may have a quadrilateral planar shape having longer sides in the first direction DR1 and shorter sides in the second direction DR2. However, the planar shape of the display device 100 is not limited thereto, and the display device 100 may have a polygonal shape other than a quadrilateral shape, a circular shape, an elliptical shape, or an atypical shape.

The display device 100 is a device for displaying (or configured to display) a moving image and/or a still image. The display device 100 may be used as a display screen of various products, such as televisions, laptop computers, monitors, billboards, and Internet of Things (IOT) devices, as well as a display screen of portable electronic devices, such as mobile phones, smart phones, tablet personal computers (tablet PCs), smart watches, watch phones, mobile communication terminals, electronic notebooks, electronic books, portable multimedia players (PMPs), navigation systems and ultra-mobile PCs (UMPCs).

The display device 100 has a display area DA from where light is emitted to display an image and a non-display area NDA that is (e.g., extends around) a periphery of the display area DA. Light for image display is not emitted from the non-display area NDA.

The display area DA may follow (e.g., may correspond to) a planar shape of the display device 100. For example, as shown in FIG. 1, the display area DA may have a quadrangular shape. However, this is merely an example, and the display area DA according to another embodiment may have a polygonal shape other than a quadrangle, a circular shape, an oval shape, or an irregular planar shape.

The display area DA may be disposed at the center or substantially at the center of the display surface of the display device 100.

The non-display area NDA may be disposed to surround (e.g., to surround in a plan view or extend around) the edge of the display area DA.

The non-display area NDA may include a first pad portion PDA1 and a second pad portion PDA2 disposed at both sides (e.g., at opposite sides) of the display area DA in the second direction DR2, a first common connection region CCA1 between the display area DA and the first pad portion PDA1, and a second common connection region CCA2 between the display area DA and the second pad portion PDA2.

Referring to FIG. 2, the display device 100 includes a plurality of emission areas EA arranged in the display area DA and being where light is emitted for image display.

The plurality of emission areas EA may include a first emission area EA1, a second emission area EA2, and a third emission area EA3, which emit different colors. In addition, the combination of the first emission area EA1, the second emission area EA2, and the third emission area EA3 adjacent to each other may form a pixel PX, which is the smallest light emitting unit configured to display white light.

For example, the display device 100 includes a plurality of pixels PX arranged in a matrix in the display area DA and configured to display colors with their luminance. Each of the plurality of pixels PX includes (e.g., is formed of) the first emission area EA1, the second emission area EA2, and the third emission area EA3 that are adjacent to each other (e.g., adjacent to each other in the first direction DR1).

An embodiment in which each of the plurality of pixels PX includes three emission areas EA1, EA2, and EA3 corresponding to different colors is illustrated and described herein, but the present disclosure is not limited thereto. For example, each of the plurality of pixels PX may include four emission areas.

The first emission area EA1 is an area from which light of a first color (hereinafter, referred to as "first light") is emitted. The first light may be light of a blue wavelength band. The blue wavelength band may be in a range of approximately 370 nm to approximately 460 nm, but the present specification is not limited thereto.

The second emission area EA2 is an area from which light of a second color (hereinafter, referred to as "second light") in a wavelength band higher than that of the first color is emitted. The second light may be light of a green wavelength band. The green wavelength band may be in a range of approximately 480 nm to approximately 560 nm, but the present specification is not limited thereto.

The third emission area EA3 is an area from which light of a third color (hereinafter, referred to as "third light") in a wavelength band higher than that of the second color is emitted. The third light may be light of a red wavelength band. The red wavelength band may be in a range of approximately 600 nm to approximately 750 nm, but the present specification is not limited thereto.

The first emission area EA1, the second emission area EA2, and the third emission area EA3 may be alternately arranged in the first direction DR1. For example, the first emission areas EA1, the second emission areas EA2, and the third emission areas EA3 may be arranged in the order of the first emission area EA1, the second emission area EA2, and the third emission area EA3 in the first direction DR1.

The first emission areas EA1 may be arranged in a line in the second direction DR2. The second emission areas EA2 may be arranged in a line in the second direction DR2. The third emission areas EA3 may be arranged in a line in the second direction DR2.

The first pad portion PDA1 may be disposed on one side (e.g., the upper side in FIG. 1) of the display device 100 in the second direction DR2. The first pad portion PDA1 may include first pads PD1 connected to an external circuit board (see, e.g., 'CB' in FIG. 3).

The second pad portion PDA2 may be disposed on the other side (e.g., the lower side in FIG. 1) of the display device 100 in the second direction DR2. The second pad portion PDA2 may include second pads to be connected to the external circuit board (CCB' in FIG. 3). In some embodiments, the second pad portion PDA2 may be omitted.

Each of the first common connection region CCA1 and the second common connection region CCA2 may include a plurality of common connection electrodes CCE.

Figure 3:
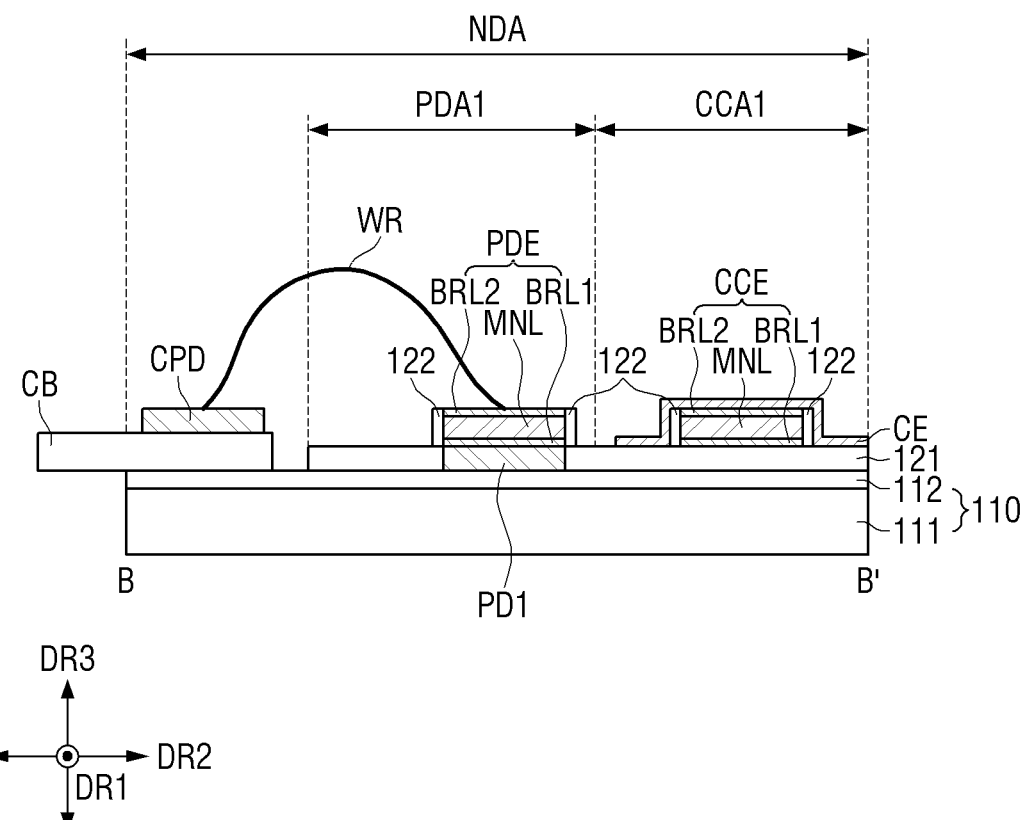
FIG. 3 is a cross-sectional view taken along the line B-B' in FIG. 2.

FIG. 3 is a cross-sectional view taken along the line B-B' of FIG. 2.

Referring to FIG. 3, the display device 100 according to one embodiment may include a circuit board 110, a first pad PD1 disposed in the first pad portion PDA1 on the circuit board 110, a first insulating layer 121 disposed on the circuit board 110 to correspond to (e.g., to extend around) the periphery of the first pad PD1, the common connection electrode CCE disposed in the first common connection region CCA1 on the first insulating layer 121, a pad connection electrode PDE disposed on the first pad PD1, a second insulating layer 122 disposed on the first insulating layer 121 to cover the side surface of each of the common connection electrode CCE and the pad connection electrode PDE, and a common electrode CE disposed on the first insulating layer 121 to cover the common connection electrode CCE.

The first pad PD1 may be connected to the common connection electrode CCE through a wire of the circuit board 110.

The circuit board CB may be fixed to one side of the edge of the circuit board 110 adjacent to the first pad portion PDA1.

The pad connection electrode PDE may be electrically connected to a pad CPD of the circuit board CB through a wire WR.

The circuit board CB may be a flexible printed circuit board (FPCB), a printed circuit board (PCB), a flexible printed circuit (FPC), or a flexible film, such as a chip on film (COF).

The common connection electrode CCE and the pad connection electrode PDE may be formed of the same layer and the same material.

For example, each of the common connection electrode CCE and the pad connection electrode PDE may include a main layer MNL formed of an intermetallic compound (IMC) alloy made of two types of metallic materials having different melting points. In some embodiments, each of the common connection electrode CCE and the pad connection electrode PDE may further include a first barrier layer BRL1 disposed on one surface of the main layer MNL adjacent to the circuit board 110 and a second barrier layer BRL2 disposed above the main layer MNL.

Figure 4:
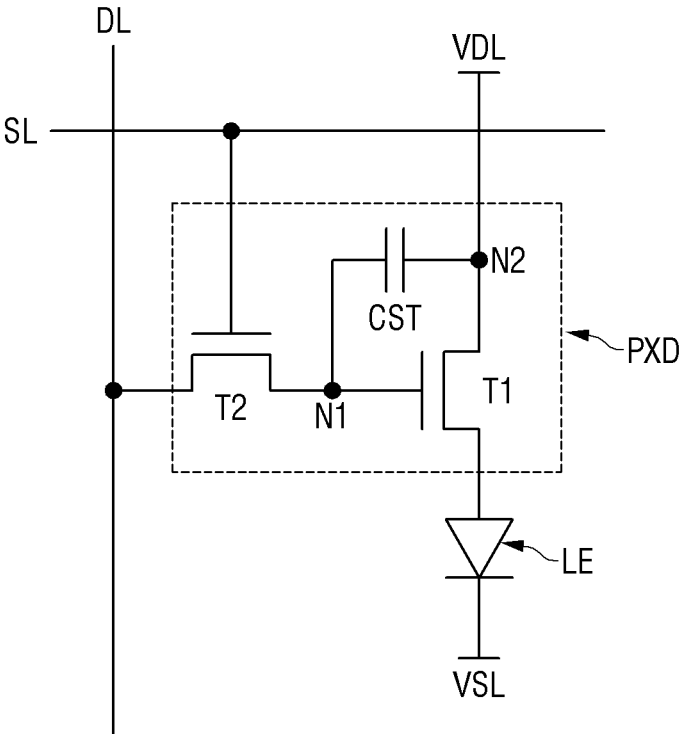
FIG. 4 is a circuit diagram illustrating an example of a light emitting element and a pixel driver corresponding to any one of the emission areas shown in FIG. 2.

FIG. 4 is a circuit diagram illustrating an example of a light emitting element and a pixel driver corresponding to any one of the emission areas shown in FIG. 2.

The circuit board 110 of the display device 100 includes a plurality of pixel drivers PXD respectively corresponding to the plurality of emission areas EA.

Referring to FIG. 4, each of the plurality of pixel drivers PXD may include at least one transistor T1, T2.

The pixel driver PXD, according to one embodiment, may include a first transistor T1 connected to a light emitting element LE, a second transistor T2 connected to the gate electrode of the first transistor T1, and a storage capacitor CST.

The first transistor T1 is disposed between the light emitting element LE and a first power line VDL, which supplies a first driving power having a high potential voltage (e.g., a predetermined high potential voltage).

The second transistor T2 is disposed between a data line DL and the gate electrode of the first transistor T1. The data line DL supplies a data signal corresponding to each frame period and each emission area EA.

The gate electrode of the second transistor T2 is connected to the scan line SL. The scan line SL supplies a scan signal for selecting whether or not to write the data signal during a partial period of each frame period.

The storage capacitor CST may be connected between a first node N1 and a second node N2. The first node N1 is the contact point between the gate electrode of the first transistor T1 and the second transistor T2, and the second node N2 is the contact point between the first transistor T1 and the power line PL. Thus, the storage capacitor CST is connected between the gate electrode and the first electrode of the first transistor T1.

When the second transistor T2 is turned on based on the scan signal of the scan line SL, the data signal of the data line DL is transmitted to the gate electrode of the first transistor T1 and the storage capacitor CST through the turned-on second transistor T2.

The first transistor T1 is turned on based on the data signal transmitted to the first node N1. A drain-source current Ids (hereinafter, referred to as "driving current") corresponding to the data signal is generated between the first electrode and the second electrode of the turned-on first transistor T1, and the driving current Ids is supplied to the light emitting element LE.

The storage capacitor CST is charged with a voltage difference between the gate electrode of the first transistor T1 and the first electrode (e.g., the source electrode connected to the first power line VDL) of the first transistor T1 based on the data signal transmitted to the first node N1.

The first transistor T1 may be maintained in the turned-on state based on the voltage charged in the storage capacitor CST.

The anode electrode of the light emitting element LE may be electrically connected to the first transistor T1, and the cathode electrode thereof may be connected to a second power line VSL through which a second driving power having a voltage lower than that of the first driving power is supplied.

The light emitting element LE emits light based on the driving current Ids caused by the turned-on first transistor T1. The luminance of the light emitting element LE may be proportional to the driving current Ids.

Although the pixel driver PXD shown in FIG. 4 includes the first transistor T1 and the second transistor T2 formed of N-type metal oxide semiconductor field effect transistors (MOSFETs), it should be understood that the pixel driver PXD is not limited to the configuration shown in FIG. 4.

For example, the pixel driver PXD according to one embodiment may include three or more transistors or two or more capacitors, and at least one of the transistors included in the pixel driver PXD may be formed of a P-type MOSFET.

Figure 5:
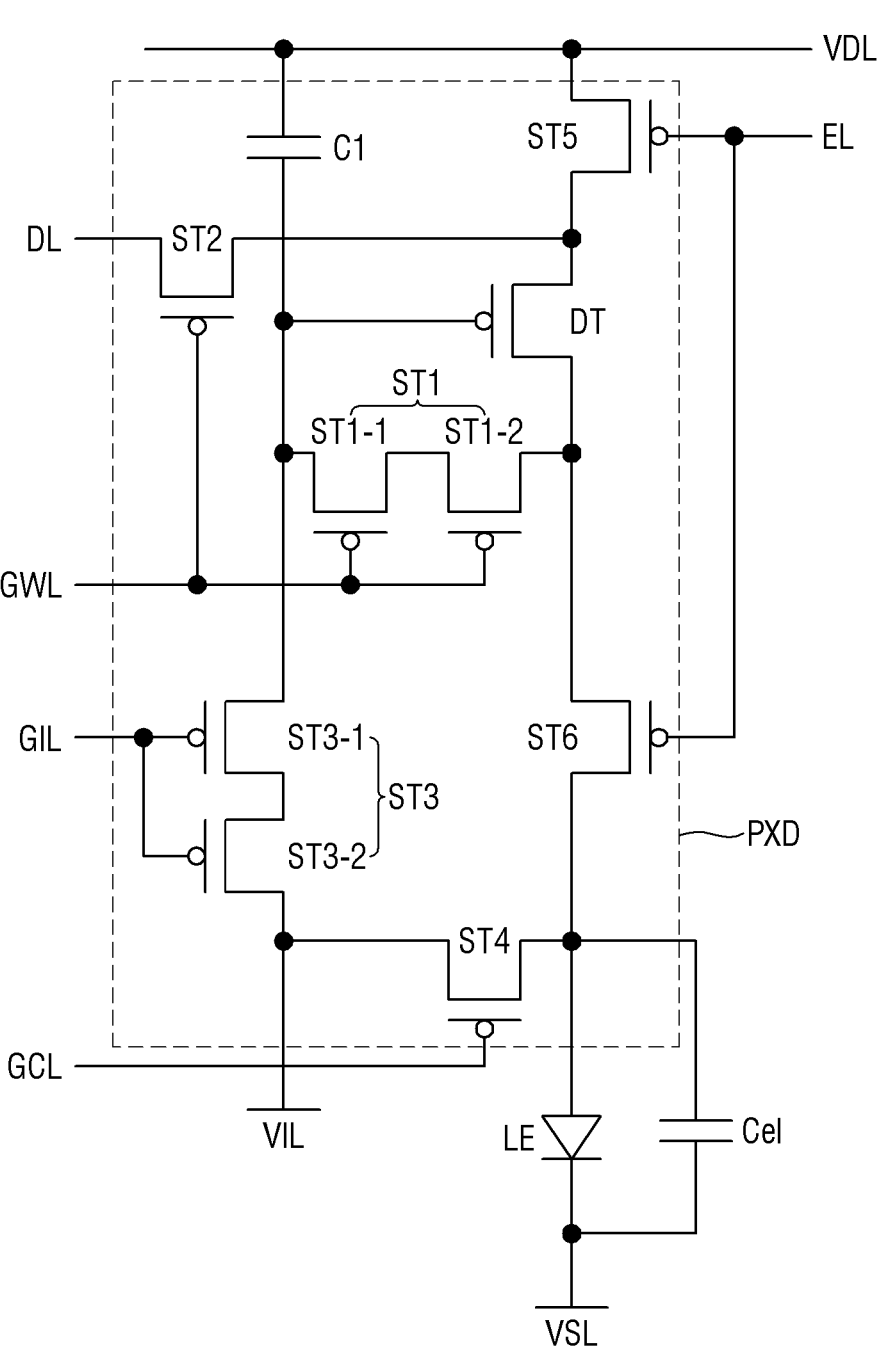
FIGS. 5 and 6 are circuit diagrams illustrating other examples of a light emitting element and a pixel driver corresponding to any one of the emission areas shown in FIG. 2.
Figure 6:
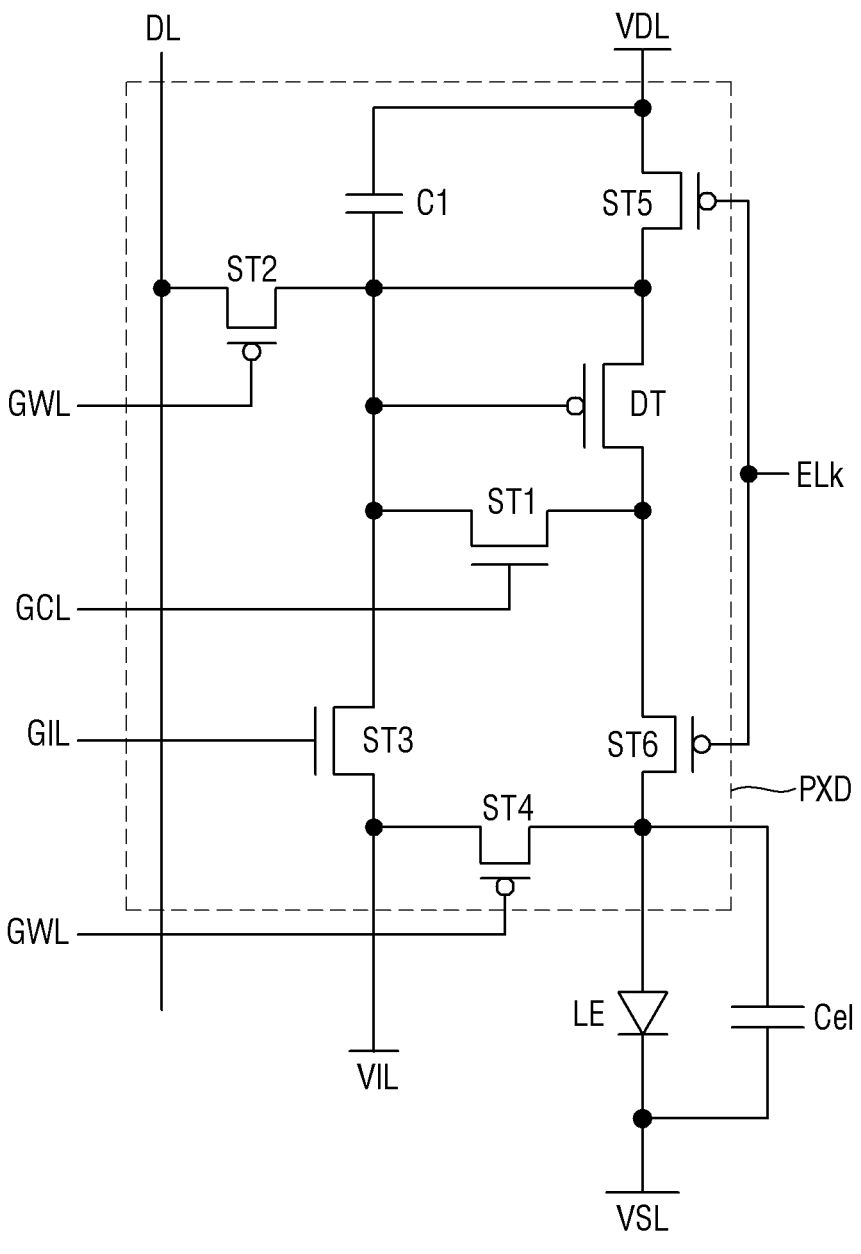

FIGS. 5 and 6 are circuit diagrams illustrating other examples of a light emitting element and a pixel driver corresponding to any one of the emission areas shown in FIG. 2.

Referring to FIG. 5, each of the plurality of pixel drivers PXD according to another embodiment may include a driving transistor DT, switch elements, and a capacitor C1. The switching elements may include first to sixth transistors ST1, ST2, ST3, ST4, ST5, and ST6.

Each of the driving transistor DT and the switch elements includes a gate electrode, a first electrode, and a second electrode.

The driving transistor DT controls a drain-source current Ids (hereinafter, referred to as "driving current") flowing between the first electrode and the second electrode according to a data voltage applied to the gate electrode.

The capacitor C1 is formed between the gate electrode of the driving transistor DT and the first power line VDL. One electrode of the capacitor C1 may be connected to the gate electrode of the driving transistor DT, and the other electrode thereof may be connected to the first power line VDL.

When the first electrode of each of the driving transistor DT and the first to sixth transistors ST1 to ST6 is a source electrode, the second electrode thereof may be a drain electrode. In another embodiment, when the first electrode of each of the driving transistor DT and the first to sixth transistors ST1 to ST6 is a drain electrode, the second electrode thereof may be a source electrode.

An active layer of each of the driving transistor DT and the first to sixth transistors ST1 to ST6 may be formed of any one of polysilicon, amorphous silicon, or an oxide semiconductor. When a semiconductor layer of each of the driving transistor DT and the first to sixth transistors ST1 to ST6 is formed of polysilicon, a process for forming the semiconductor layer may be a low temperature polysilicon (LTPS) process.

The driving transistor DT is connected in series to the light emitting element LE between the first power line VDL and the second power line VSL.

For example, the first electrode (e.g., source electrode) of the driving transistor DT may correspond to (e.g., may be connected to) the first power line VDL, and the second electrode (e.g., drain electrode) of the driving transistor DT may correspond to (e.g., may be connected to) the first electrode (e.g., anode electrode) of the light emitting element LE.

The second electrode (e.g., cathode electrode) of the light emitting element LE may be connected to the second power line VSL.

A parasitic capacitance Cel may be formed between both ends of the light emitting element LE.

The capacitor C1 may be connected between the gate electrode of the driving transistor DT and the first power line VDL.

The first transistor ST1 may be connected between the gate electrode of the driving transistor DT and the second electrode (e.g., drain electrode) of the driving transistor DT. When the first transistor ST1 is turned on based on a gate signal of a write scan line GWL, the gate electrode of the driving transistor DT and the second electrode of the driving transistor DT may be changed to have the same potential.

The second transistor ST2 may be connected between a data line DL and the first electrode (e.g., source electrode) of the driving transistor DT. When the second transistor ST2 is turned on based on the gate signal of the write scan line GWL, a data signal of the data line DL may be transmitted to the first electrode of the driving transistor DT.

In the illustrated embodiment, if a voltage difference between the gate electrode of the driving transistor DT and the first electrode of the driving transistor DT becomes equal to or greater than a threshold voltage, the driving transistor DT is turned on, and a driving current corresponding to the voltage difference between the gate electrode and the source electrode is generated.

The third transistor ST3 may be connected between the gate electrode of the driving transistor DT and an initialization voltage line VIL. When the third transistor ST3 is turned on by a gate signal of an initialization scan line GIL, the potential of the gate electrode of the driving transistor DT may be initialized to the voltage of the initialization voltage line VIL.

The fourth transistor ST4 may be connected between the first electrode (e.g., anode electrode) of the light emitting element LE and the initialization voltage line VIL. When the fourth transistor ST4 is turned on by a gate signal of a control scan line GCL, the potential of the first electrode (e.g., anode electrode) of the light emitting element LE may be initialized to the voltage of the initialization voltage line VIL.

The fifth transistor ST5 may be connected between the first power line VDL and the driving transistor DT.

The sixth transistor ST6 may be connected between the driving transistor DT and the light emitting element LE.

When the fifth transistor ST5 and the sixth transistor ST6 are turned on by a gate signal of an emission line EL, the driving current by the driving transistor DT may be supplied to the light emitting element LE.

The driving transistor DT and the first to sixth transistors ST1 to ST6 described with reference to FIG. 5 are shown as being formed of p-type metal oxide semiconductor field effect transistors (MOSFETs), but without being limited thereto, they may be formed of n-type MOSFETs.

For example, referring to FIG. 6, from among the transistors DT and ST1 to ST6 provided in each of the plurality of pixel drivers PXD, the driving transistor DT, the second transistor ST2, the fourth transistor ST4, the fifth transistor ST5, and the sixth transistor ST6 may be formed of P-type MOSFETs, and the first transistor ST1 and the third transistor ST3 may be formed of N-type MOSFETs.

In such an embodiment, the gate electrode of the first transistor ST1 formed of the N-type MOSFET may be connected to the control scan line GCL, not the write scan line GWL. Thus, the first transistor ST1 may be turned on by the gate signal of the control scan line GCL.

Further, the write scan line GWL may be connected to the gate electrode of the fourth transistor ST4 formed of the P-type MOSFET.

Here, the gate signal of the control scan line GCL and the gate signal of the initialization scan line GIL may have a gate high voltage for turning on the N-type MOSFET.

On the other hand, the gate signal of the write scan line GWL and the gate signal of the emission line EL may have a gate low voltage for turning on the P-type MOSFET.

An active layer of each of the driving transistor DT, the second transistor ST2, the fourth transistor ST4, the fifth transistor ST5, and the sixth transistor ST6 configured as the P-type MOSFETs may be formed of polysilicon, while an active layer of each of the first transistor ST1 and the third transistor ST3 configured as the N-type MOSFETs may be formed of an oxide semiconductor.

The pixel driver PXD is not limited to the embodiments described with respect to FIGS. 4, 5, and 6 and may be formed in another suitable circuit structure.

Next, display devices 100A to 100D according to embodiments will be described.

Figure 7:
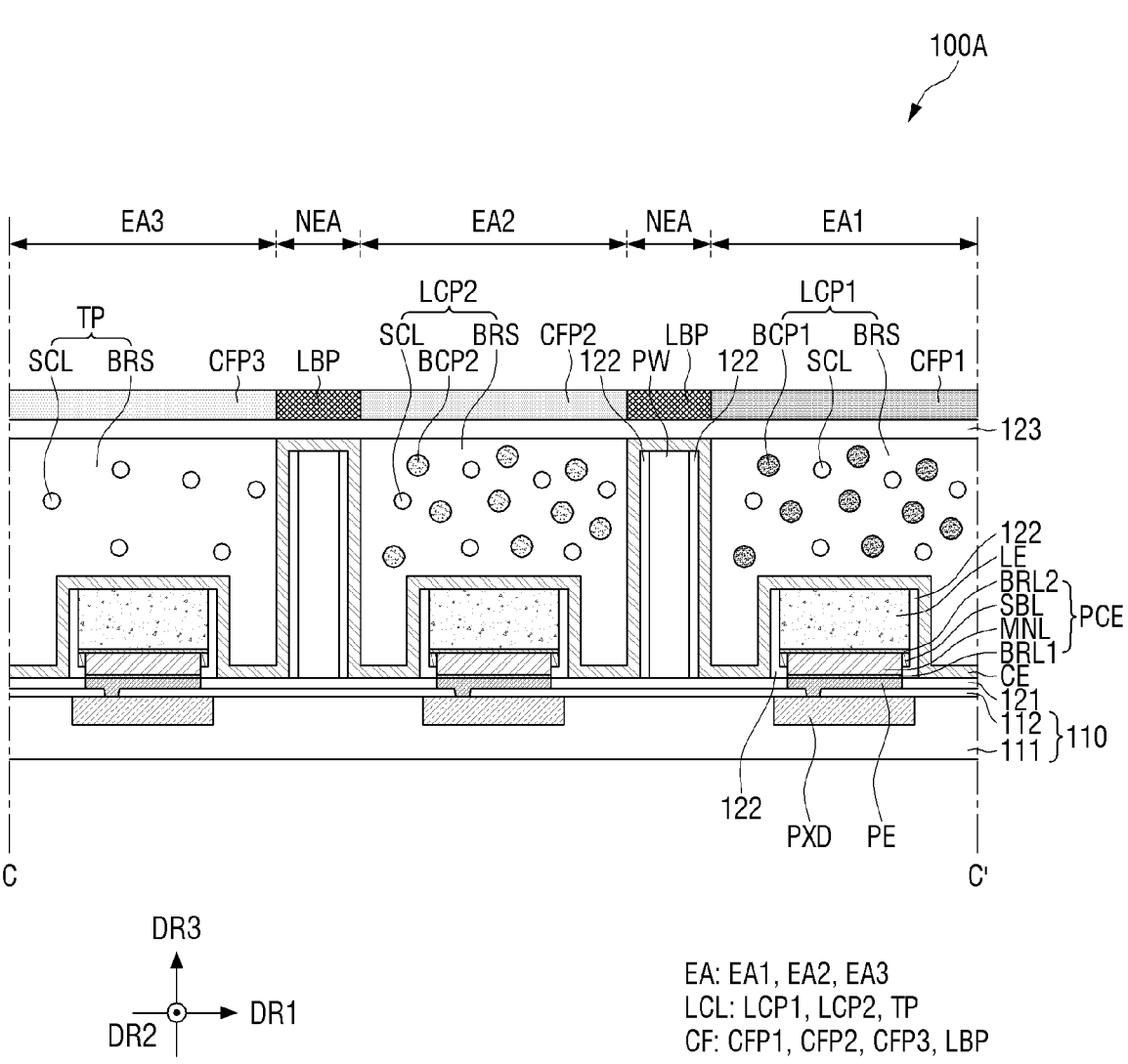
FIG. 7 is a cross-sectional view taken along the line C-C' in FIG. 2 according to a first embodiment.
Figure 8:
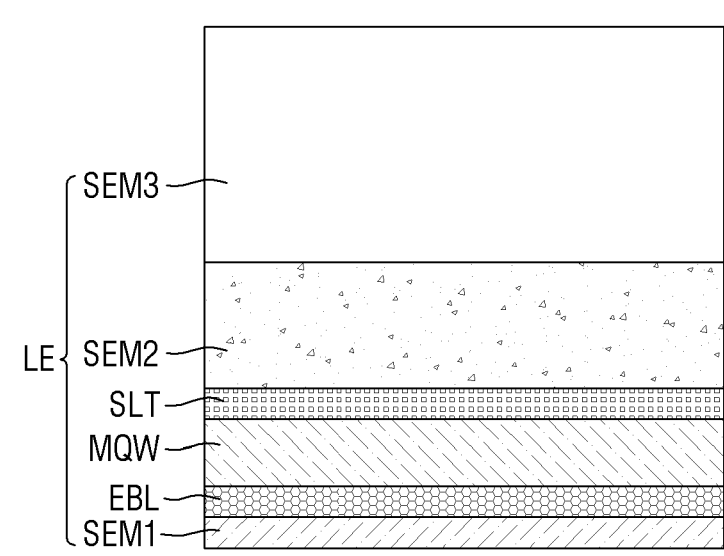
FIG. 8 is an enlarged cross-sectional view illustrating an example of any one of the light emitting elements shown in FIG. 7.
Figure 8:
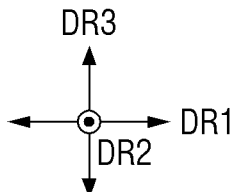

FIG. 7 is a cross-sectional view taken along the line C-C' of FIG. 2 according to a first embodiment. FIG. 8 is an enlarged cross-sectional view illustrating an example of any one of the light emitting elements shown in FIG. 7.

Referring to FIG. 7, the display device 100A according to the first embodiment includes the circuit board 110 including the plurality of pixel drivers PXD corresponding to the plurality of emission areas EA, a plurality of pixel electrodes PE disposed on the circuit board 110 to correspond to the plurality of emission areas EA, a plurality of pixel connection electrodes PCE respectively disposed on the plurality of pixel electrodes PE, and a plurality of light emitting elements LE respectively disposed on the pixel connection electrodes PCE.

Each of the plurality of pixel connection electrodes PCE includes the main layer MNL disposed on each of the plurality of pixel electrodes PE and a sub-layer SBL surrounding a part of the side surface of the main layer MNL that is in contact with the top surface of the main layer MNL and is made of a material different from that of the main layer MNL.

The circuit board 110 may include a silicon substrate 111, on which the plurality of pixel drivers PXD are disposed, and an interlayer insulating layer 112 disposed on the silicon substrate 111 to cover the plurality of pixel drivers PXD.

The silicon substrate 111 may be prepared by a semiconductor process using a silicon wafer.

The interlayer insulating layer 112 may be formed as a single layer or multiple layers (e.g., a plurality of layers) made of an inorganic insulating material, such as silicon nitride (SiN$_x$), silicon oxide (SiO$_2$), aluminum oxide (Al$_2$O$_3$), or hafnium oxide (HfO$_x$).

Each of the plurality of pixel electrodes PE may be disposed on the interlayer insulating layer 112 of the circuit board 110 and may be electrically connected to the plurality of pixel drivers PXD through a hole (e.g., an opening) penetrating at least the interlayer insulating layer 112.

Each of the plurality of pixel electrodes PE may be formed as a single layer or multiple layers made of at least one of gold (Au), copper (Cu), aluminum (Al), or tin (Sn).

The plurality of pixel electrodes PE may be electrically connected to the plurality of light emitting elements LE through the plurality of pixel connection electrodes PCE.

Each of the plurality of pixel connection electrodes PCE includes the main layer MNL, disposed on each of the plurality of pixel electrodes PE, and the sub-layer SBL surrounding a part of the upper side surface of the main layer MNL.

The width of the main layer MNL of each of the plurality of pixel connection electrodes PCE corresponds to that of each of the plurality of pixel electrodes PE.

The width of the sub-layer SBL of each of the plurality of pixel connection electrodes PCE corresponds to that of each of the plurality of light emitting elements LE.

For example, the plurality of pixel electrodes PE corresponds only to the main layers MNL of the plurality of pixel connection electrodes PCE, while each of the plurality of light emitting elements LE is disposed on the main layer MNL and the sub-layer SBL of each of the plurality of pixel connection electrodes PCE. Therefore, each of the plurality of light emitting elements LE has a width greater than that of each of the plurality of pixel electrodes PE.

The main layer MNL may be made of an alloy of a first metallic material and a second metallic material having a melting point lower than that of the first metallic material.

For example, the main layer MNL may be made of an IMC alloy prepared by infiltrating (e.g., mixing or alloying) the second metallic material having a relatively low melting point in a molten state into the first metallic material.

For example, the first metallic material may be any one of gold (Au), silver (Ag), or copper (Cu), which have a relatively high melting point.

In addition, a metal having a melting point lower than that of the first metallic material may be selected as the second metallic material. For example, the second metallic material may be tin (Sn).

In other words, the main layer MNL may be made of an IMC alloy of any one of AuSn, AgSn, or CuSn.

The sub-layer SBL may be made of the first metallic material.

Because the sub-layer SBL is disposed to surround only a part of the side surface of the main layer MNL that is in contact with the top surface of the main layer MNL, the sub-layer SBL is spaced apart in the third direction DR3 from the pixel electrode PE in contact with the bottom surface of the main layer MNL.

Each of the plurality of pixel connection electrodes PCE may further include the first barrier layer BRL1 disposed between one surface of the main layer MNL and each of the plurality of pixel electrodes PE and the second barrier layer BRL2 disposed between each of the plurality of light emitting elements LE and the sub-layer SBL on the opposite surface of the main layer MNL.

Each of the first barrier layer BRL1 and the second barrier layer BRL2 may be made of a material that blocks diffusion of the second metallic material.

For example, each of the first barrier layer BRL1 and the second barrier layer BRL2 may be made of titanium (Ti).

The plurality of pixel connection electrodes PCE may be formed to have the same layers (or the same layer structure) as that of the plurality of common connection electrodes CCE (see, e.g., FIG. 3).

The plurality of light emitting elements LE may be provided as vertical light emitting diode elements. The plurality of light emitting elements LE may be micro light emitting diodes or nano light emitting diodes.

For example, a thickness of each of the plurality of light emitting elements LE in the third direction DR3 may be in a range of about 1 μm to about 5 μm.

Referring to FIG. 8, each of the plurality of light emitting elements LE may include a first semiconductor layer SEM1 made of a semiconductor material doped with a dopant of a first conductivity type, an active layer MQW disposed on the first semiconductor layer SEM1, and a second semiconductor layer SEM2 disposed on the active layer MQW and made of a semiconductor material doped with a dopant of a second conductivity type different from the first conductivity type.

In some embodiments, each of the plurality of light emitting elements LE may further include a third semiconductor layer SEM3 disposed on the second semiconductor layer SEM2 and made of an undoped semiconductor material.

In some embodiments, each of the plurality of light emitting elements LE may further include an electron blocking layer EBL disposed between the first semiconductor layer SEM1 and the active layer MQW and a superlattice layer SLT disposed between the active layer MQW and the second semiconductor layer SEM2.

The first semiconductor layer SEM1 may be disposed on the pixel connection electrode PCE. The first semiconductor layer SEM1 may be doped with a first conductive dopant, such as Mg, Zn, Ca, Se, Ba, or the like. For example, the first semiconductor layer 31 may be p-GaN doped with p-type Mg. The thickness of the first semiconductor layer 31 may be in a range of about 30 nm to about 200 nm.

The electron blocking layer EBL may be disposed on the first semiconductor layer SEM1. The electron blocking layer EBL may be a layer for suppressing or preventing too many electrons from flowing into the active layer MQW. For example, the electron blocking layer EBL may be p-AlGaN doped with p-type Mg. The thickness of the electron blocking layer EBL may be in a range of about 10 to about 50 nm. In some embodiments, the electron blocking layer EBL may be omitted.

The active layer MQW may be disposed on the electron blocking layer EBL. The active layer MQW may emit light by the coupling of electron-hole pairs according to an electrical signal applied through the first semiconductor layer SEM1 and the second semiconductor layer SEM2. The active layer MQW may emit the first light having a central wavelength band in a range of about 450 nm to about 495 nm (e.g., may emit light of a blue wavelength band).

The active layer MQW may include a material having a single or multiple quantum well structure. When the active layer MQW contains a material having a multiple quantum well structure, the active layer MQW may have the structure in which a plurality of well layers and barrier layers are alternately laminated. In some embodiments, the well layer may be formed of InGaN, and the barrier layer may be formed of GaN or AlGaN, but the present disclosure is not limited thereto. The thickness of the well layer may be in a range of about 1 nm to about 4 nm, and the thickness of the barrier layer may be in a range of about 3 nm to about 10 nm.

In some embodiments, the active layer MQW may have a structure in which semiconductor materials having large band gap energy and semiconductor materials having small band gap energy are alternately stacked and may include other Group III to V semiconductor materials according to the wavelength band of light to be emitted. The light emitted by the active layer MQW is not limited to the first light (e.g., light of the blue wavelength band), and in some embodiments, light emitting elements for emitting the second light (e.g., light of the green wavelength band) or the third light (e.g., light of the red wavelength band) may be emitted.

The superlattice layer SLT may be disposed on the active layer MQW. The superlattice layer SLT may be a layer for relieving stress between the second semiconductor layer SEM2 and the active layer MQW. For example, the superlattice layer SLT may be formed of InGaN or GaN. The thickness of the superlattice layer SLT may be in a range of about 50 nm to about 200 nm. In some embodiments, the superlattice layer SLT may be omitted.

The second semiconductor layer SEM2 may be disposed on the superlattice layer SLT. The second semiconductor layer SEM2 may be doped with a second conductive dopant, such as Si, Ge, Sn, or the like. For example, the second semiconductor layer SEM2 may be n-GaN doped with n-type Si. The thickness of the second semiconductor layer SEM2 may be in a range of about 500 nm to about 1 μm.

The third semiconductor layer SEM3 may be an undoped Gan. In some embodiments, the third semiconductor layer SEM3 may be omitted.

The plurality of pixel connection electrodes PCE may be respectively disposed between the plurality of pixel electrodes PE and the first semiconductor layers SEM1 of the plurality of light emitting elements LE.

As shown in FIG. 7, the display device 100A according to the first embodiment may further include the first insulating layer 121 disposed on the circuit board 110 to correspond to a separation region (e.g., to fill an area) between the plurality of pixel electrodes PE and a barrier wall PW disposed on the first insulating layer 121 to correspond to a non-emission area NEA, which is a separation region between the plurality of emission areas EA, and spaced apart from the plurality of light emitting elements LE. The second insulating layer 122 may cover the side surface of each of the plurality of light emitting elements LE and the side surface of the barrier wall PW, and the common electrode CE is disposed above the circuit board 110 to cover the plurality of light emitting elements LE, the barrier wall PW, and the second insulating layer 122.

The first insulating layer 121 may be formed of an inorganic layer, such as a silicon oxide layer ($SiO_2$), an aluminum oxide layer ($Al_2O_3$), or a hafnium oxide layer ($HfO_x$), but it is not limited thereto.

The barrier wall PW is for separating the plurality of emission areas EA from each other and may have a thickness sufficient to allow a light control layer LCL to effectively control light characteristics.

The barrier wall PW may be provided to have a thickness greater than that of each light emitting element LE and each pixel connection electrode PCE.

For example, the barrier wall PW may be made of an organic insulating material may be easily thickly disposed, but this is merely an example.

The second insulating layer 122 may be formed of an inorganic layer, such as a silicon oxide layer ($SiO_2$), an aluminum oxide layer ($Al_2O_3$), or a hafnium oxide layer ($HfO_x$), but it is not limited thereto.

The common electrode CE corresponds to the plurality of emission areas EA and the non-emission area NEA and covers the plurality of light emitting elements LE, the barrier wall PW, and the second insulating layer 122.

The common electrode CE may be electrically connected to the second semiconductor layers SEM2 of the plurality of light emitting elements LE.

For example, the common electrode CE may be in contact with the second semiconductor layers SEM2 of the plurality of light emitting elements LE.

In some embodiments, when the plurality of light emitting elements LE include the third semiconductor layers SEM3, the common electrode CE may be in contact with the third semiconductor layers SEM3 of the plurality of light emitting elements LE.

In addition, the common electrode CE may extend to at least the first common connection region CCA1 to further cover the common connection electrode CCE, thereby being electrically connected to the common connection electrode CCE.

The common electrode CE may be made of a transparent conductive material. For example, the common electrode CE may be formed of a transparent conductive oxide (TCO), such as indium tin oxide (ITO) or indium zinc oxide (IZO).

The display device 100A according to the first embodiment may further include the light control layer LCL disposed on the common electrode CE and including a plurality of light control patterns LCP1, LCP2, and TP surrounded by (e.g., surrounded along a periphery by) the barrier wall PW, a third insulating layer 123 disposed on the light control layer LCL and the common electrode CE, and a color filter CF disposed on the third insulating layer 123.

As mentioned above, the plurality of emission areas EA may include the first emission area EA1 from which light of the first color in a wavelength band is emitted, a second emission area EA2 from which light of the second color in a wavelength band higher than that of the first color is emitted, and a third emission area EA3 from which light of the third color in a wavelength band higher than that of the second color is emitted. In some embodiments, the first color, the second color, and the third color may be blue, green, and red, respectively.

In some embodiments, the plurality of light emitting elements LE corresponding to the plurality of emission areas EA may be identically provided to emit light in the wavelength band of blue or higher.

Accordingly, the display device 100A according to the first embodiment may further include the light control layer LCL and the color filter CF to control the wavelength band or the like of light from the plurality of light emitting elements LE.

For example, the plurality of light emitting elements LE may emit light of the third color.

In such an embodiment, the light control layer LCL may include a first light control pattern LCP1 corresponding to the first emission area EA1 and including first wavelength conversion particles BCP1 that convert the light from the light emitting element LE into light of the wavelength band of the first color, a second light control pattern LCP2 corresponding to the second emission area EA2 and including second wavelength conversion particles BCP2 that convert the light from the light emitting element LE into light of the wavelength band of the second color, and a light transmission pattern TP corresponding to the third emission area EA3 and transmitting light from the light emitting element LE.

Each of the first light control pattern LCP1, the second light control pattern LCP2, and the light transmission pattern TP may further include scattering particles SCL for improving light emission efficiency.

The first light control pattern LCP1 of the first emission area EA1 may be formed of a base resin BRS in which the scattering particles SCL and the first wavelength conversion particles BCP1 are dispersed.

The second light control pattern LCP2 of the second emission area EA2 may be formed of the base resin BRS in which the scattering particles SCL and the second wavelength conversion particles BCP2 are dispersed.

The light transmission pattern TP of the third emission area EA3 may be formed of the base resin BRS in which scattering particles SCL are dispersed.

Each of the first wavelength conversion particle BCP1 and the second wavelength conversion particle BCP2 may be a quantum dot (QD), a quantum bar, a fluorescent material, or a phosphorescent material. Examples of the quantum dot may include Group IV nanocrystal, Group II-VI compound nanocrystal, Group III-V compound nanocrystal, Group IV-VI nanocrystal, or a combination thereof.

The QD may include a core and a shell that overcoats the core. The core may be at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, or Ge, but it is not limited thereto. The shell may include at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, or PbTe, but it is not limited thereto.

The scattering particles SCL may include metal oxide particles or organic particles. For example, the metal oxide may be titanium oxide ($TiO_2$), zirconium oxide ($ZrO_2$), silicon dioxide ($SiO_2$), aluminum oxide ($Al_2O_3$), indium oxide ($In_2O_3$), zinc oxide (ZnO), or tin oxide ($SnO_2$). In addition, the organic particles may include an acrylic resin or a urethane-based resin. The diameter of the scattering particle may be in a range of several to several tens of nanometers.

The base resin BRS may contain a transparent organic material. For example, the base resin may contain an epoxy resin, an acrylic resin, a cardo resin, or an imide resin.

The third insulating layer 123 protects the common electrode CE and the light control layer LCL from electric shock and physical shock.

The third insulating layer 123 may be formed of an inorganic layer, such as a silicon oxide layer ($SiO_2$), an aluminum oxide layer ($Al_2O_3$), or a hafnium oxide layer ($HfO_x$), but it is not limited thereto.

The color filter CF may include a first color filter pattern CFP1 that corresponds to the first emission area EA1 and transmits light of the first color, a second color filter pattern CFP2 that corresponds to the second emission area EA2 and transmits light of the second color, a third color filter pattern CFP3 that corresponds to the third emission area EA3 and transmits light of the third color, and a light blocking pattern LBP that corresponds to the non-emission area NEA and blocks light.

As described above, the display device 100A according to the first embodiment includes the plurality of pixel connection electrodes PCE, each including the main layer MNL of an IMC alloy and the sub-layer SBL surrounding a part of the upper side surface of the main layer MNL.

The widths of the plurality of pixel electrodes PE are limited to that of the main layer MNL of the plurality of pixel connection electrodes PCE, while each of the plurality of light emitting elements LE is disposed on the main layer MNL and the sub-layer SBL of each of the plurality of pixel connection electrodes PCE.

Therefore, because the widths of the plurality of light emitting elements LE are not limited to the widths of the plurality of pixel electrodes PE, the amount of light output from (e.g., emitted by) the plurality of light emitting elements LE may be increased, and thus, the luminance of the display device 100A may be improved.

In addition, because the sub-layer SBL is not made of an IMC alloy, the process difficulty of a step of preparing the plurality of pixel connection electrodes PCE may be reduced.

Figure 9:
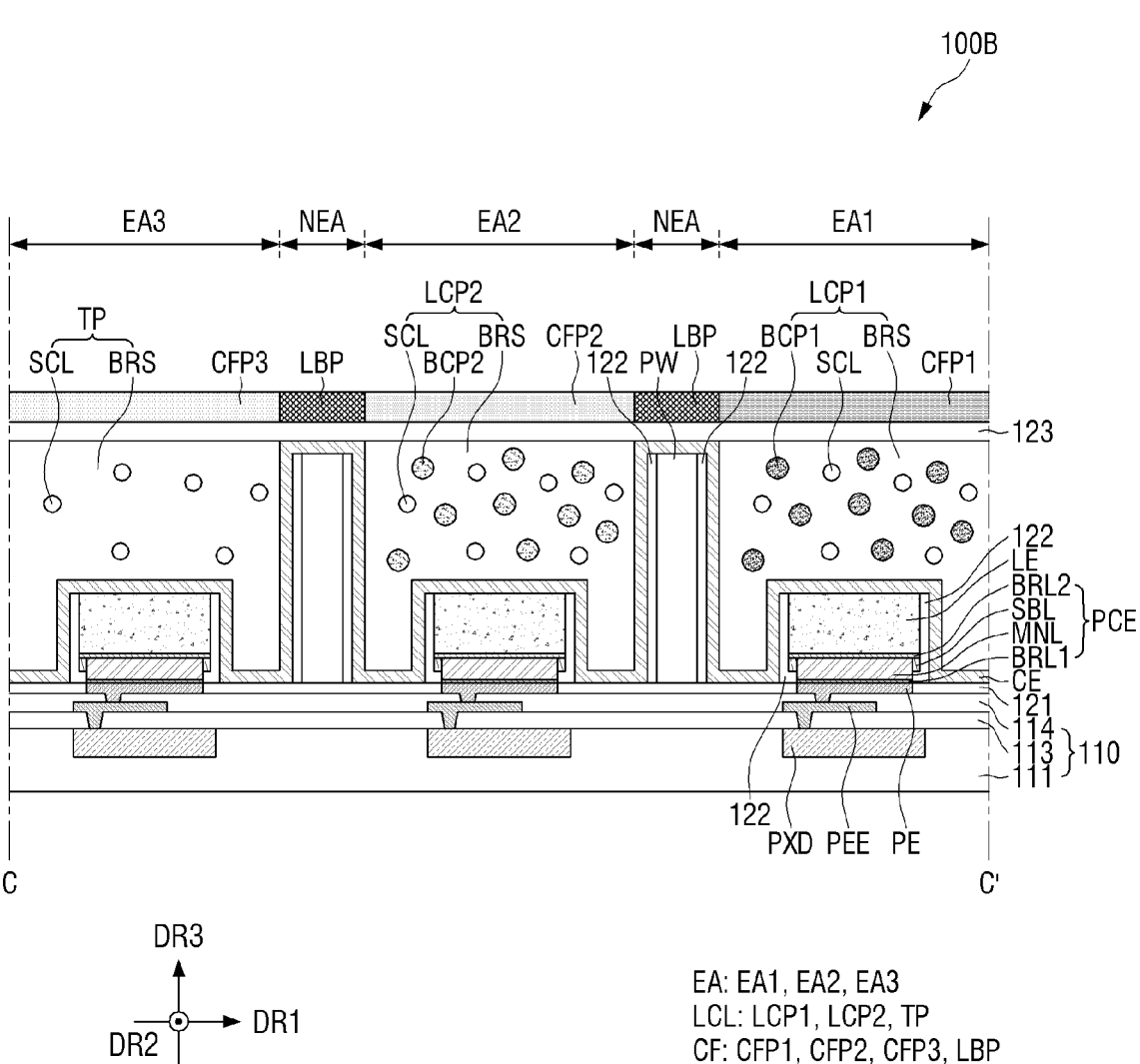
FIG. 9 is a cross-sectional view taken along the line C-C' in FIG. 2 according to a second embodiment.

FIG. 9 is a cross-sectional view taken along the line C-C' of FIG. 2 according to a second embodiment.

Referring to FIG. 9, the display device 100B according to the second embodiment is substantially the same as that of the first embodiment shown in FIGS. 7 and 8 except that the circuit board 110 further includes a plurality of pixel extension electrodes PEE. A redundant description of previously described aspects, features, and elements will be omitted while the differences therebetween will be primarily described.

The circuit board 110 of the display device 100B according to the second embodiment may include the silicon substrate 111, on which the plurality of pixel drivers PXD are disposed, a first interlayer insulating layer 113 that covers the plurality of pixel drivers PXD, the plurality of pixel extension electrodes PEE disposed on the first interlayer insulating layer 113 and respectively connected to the plurality of pixel drivers PXD, and a second interlayer insulating layer 114 that covers the plurality of pixel extension electrodes PEE.

In this embodiment, the plurality of pixel electrodes PE and the first insulating layer 121 may be disposed on the second interlayer insulating layer 114.

In addition, the plurality of pixel electrodes PE may be respectively connected to the plurality of pixel extension electrodes PEE through a hole (e.g., an opening) penetrating the second interlayer insulating layer 114.

Thus, even if the plurality of pixel electrodes PE is not disposed to overlap (e.g., are offset from) the plurality of pixel drivers PXD, the pixel electrodes PE may be respectively connected to the plurality of pixel drivers PXD through the plurality of pixel extension electrodes PEE. Therefore, the arrangement shape of the plurality of pixel drivers PXD may not be limited to be similar to the arrangement shape of the plurality of emission areas EA, and thus, integration of the circuit board 110 may be easier.

Figure 10:
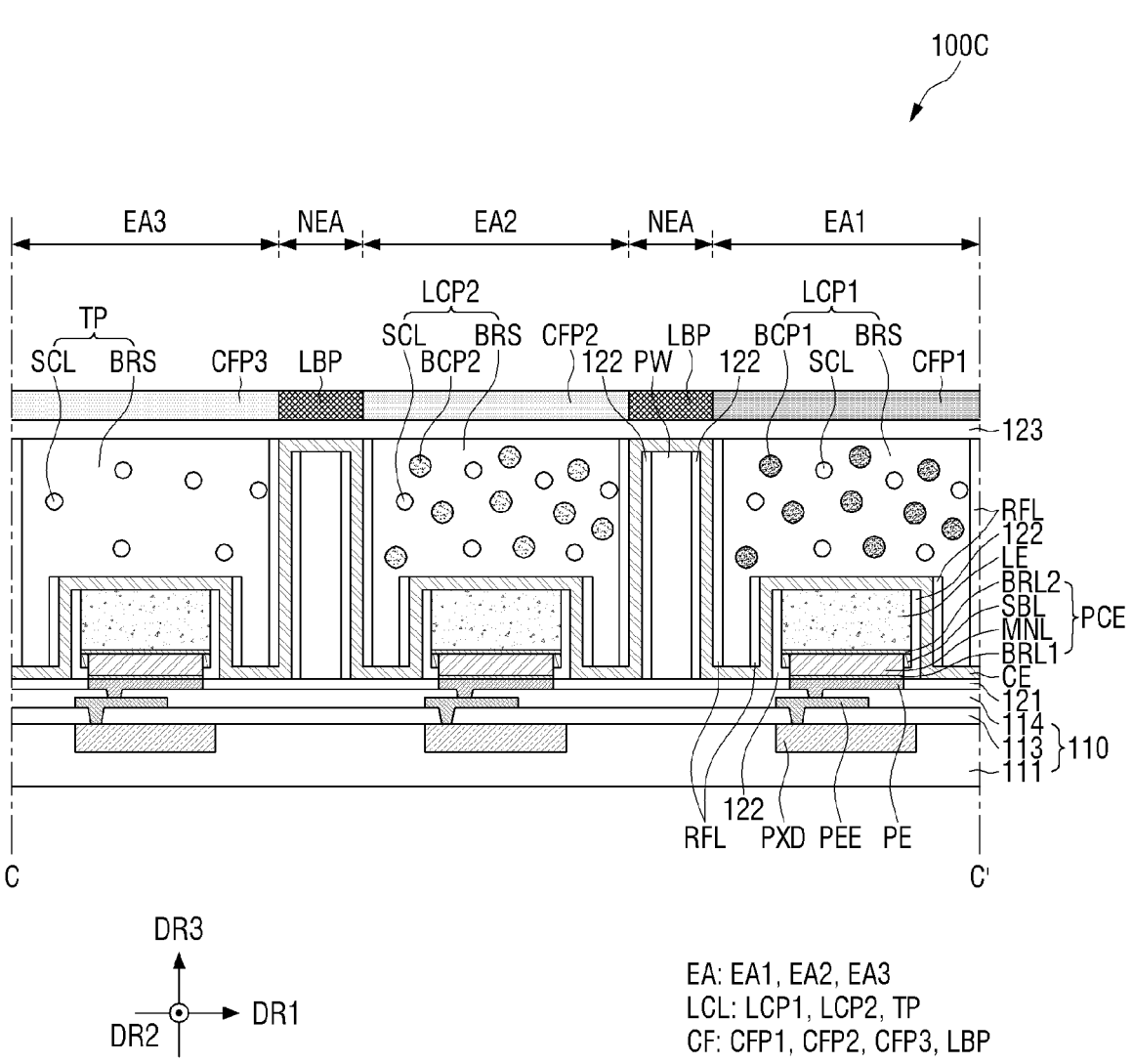
FIG. 10 is a cross-sectional view taken along the line C-C' in FIG. 2 according to a third embodiment.

FIG. 10 is a cross-sectional view taken along the line C-C' of FIG. 2 according to a third embodiment.

Referring to FIG. 10, the display device 100C according to the third embodiment is substantially the same as the display device 1008 of the second embodiment shown in FIG. 9 except that it further includes a reflective layer RFL covering a part of the common electrode CE corresponding to the side surface of each of the plurality of light emitting elements LE and the side surface of the barrier wall PW. A redundant description of previously described aspects, features, and elements will be omitted while the differences therebetween will be primarily described.

The reflective layer RFL reflects the light from the light emitting element LE and the light control layer LCL in each of the plurality of emission areas EA toward the color filter CF.

The reflective layer RFL may be made of a highly reflective metallic material, such as aluminum (Al). The thickness of the reflective layer RFL may be about 0.1 µm.

When the reflective layer RFL is further included as described above, the light emission efficiency of each of the plurality of emission areas EA may be improved.

Figure 11:
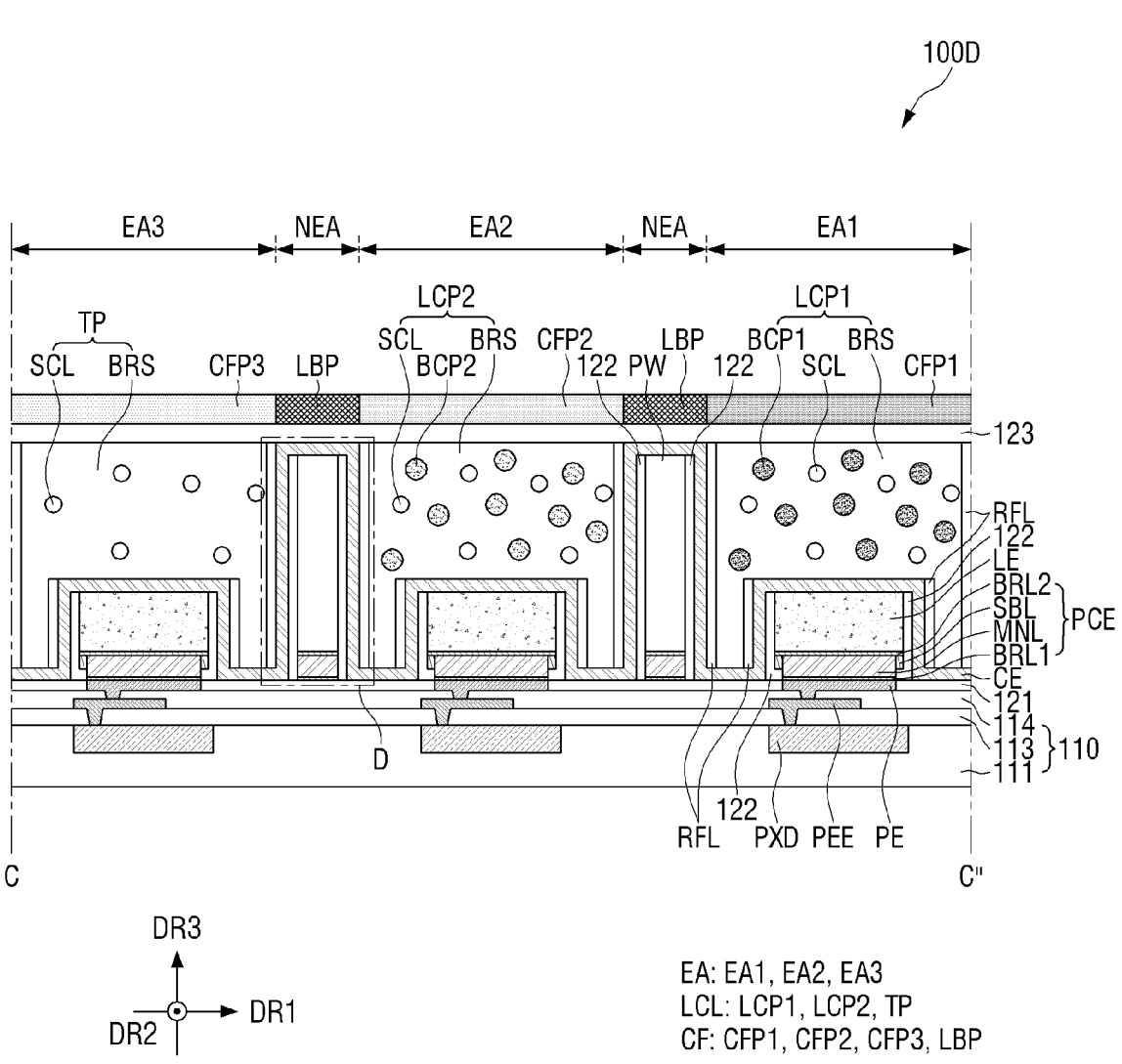
FIG. 11 is a cross-sectional view taken along the line C-C' in FIG. 2 according to a fourth embodiment.
Figure 12:
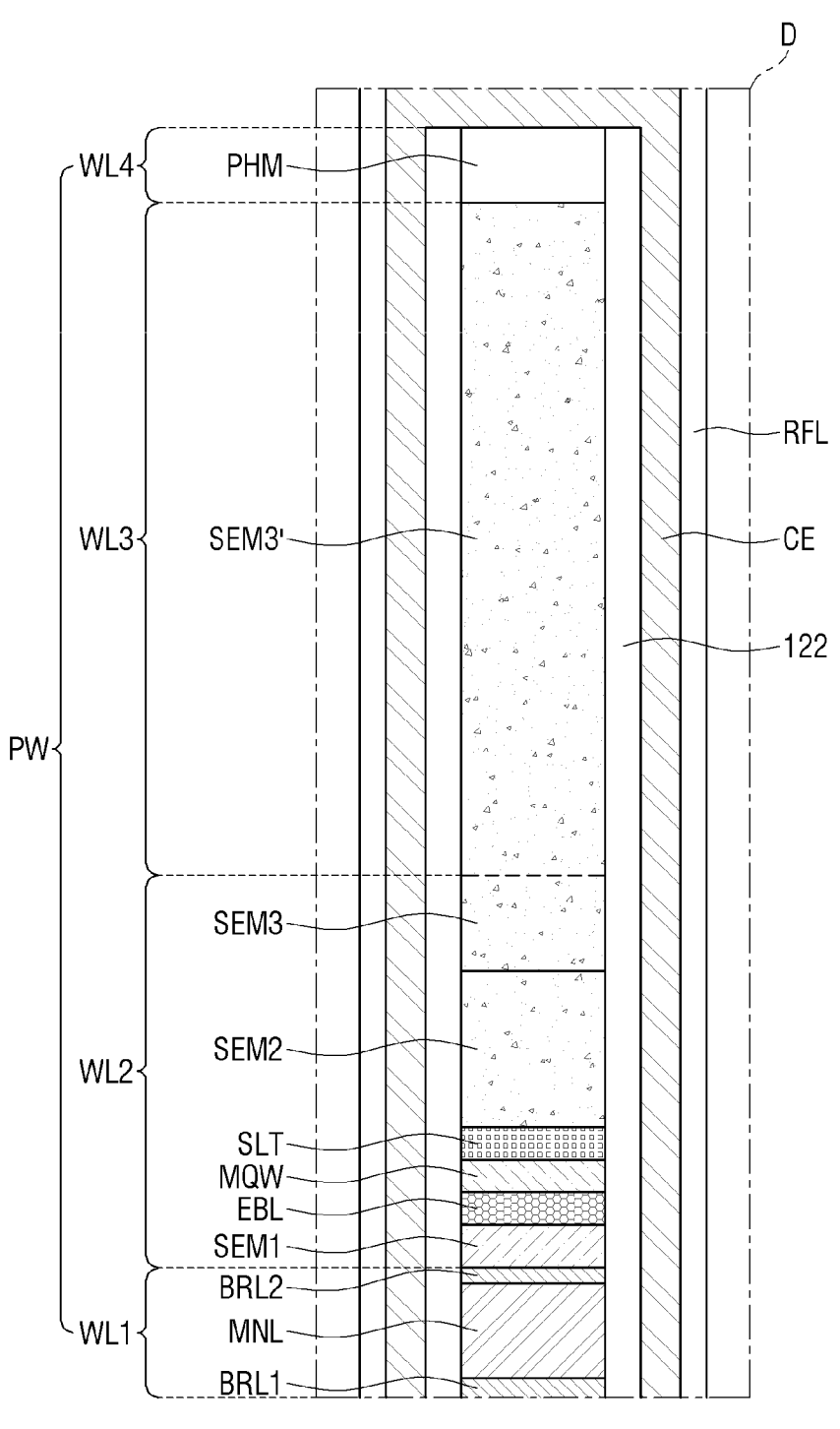
FIG. 12 is an enlarged view of the portion D of FIG. 11.

FIG. 11 is a cross-sectional view taken along the line C-C' of FIG. 2 according to a fourth embodiment. FIG. 12 is an enlarged cross-sectional view off the portion D of FIG. 11.

Referring to FIGS. 11 and 12, the display device 100D according to the fourth embodiment is substantially the same as the display device 100C of the third embodiment shown in FIG. 10 except that the barrier wall PW includes a part formed of the same layer as that of the plurality of pixel connection electrodes PCE and another part formed of the same layer as that of the plurality of light emitting elements LE. A redundant description of previously described aspects, features, and elements will be omitted while the differences therebetween will be primarily described.

As shown in FIG. 12, the barrier wall PW of the display device 100D according to the fourth embodiment may include a first wall layer WL1 disposed on the first insulating layer 121 and formed of the same layer BRL1, MNL, and BRL2 as that of the plurality of pixel connection electrodes PCE, a second wall layer WL2 disposed on the first wall layer WL1 and formed of the same layer SEM1, EBL, MQW, SLT, SEM2, and SEM3 as that of the plurality of light emitting elements LE, a third wall layer WL3 disposed on the second wall layer WL2 and made of a semiconductor material SEM3', and a fourth wall layer WL4 disposed on the third wall layer WL3 and made of a mask material PHM.

When the barrier wall PW is provided together through a mask process for disposing the plurality of light emitting elements LE, the manufacturing process may be more easily facilitated. In addition, damage to the plurality of light emitting elements LE, which can be incidentally generated during a separate process for disposing the barrier wall PW, may be avoided.

Next, steps of a method for manufacturing the display device 100D according to the fourth embodiment will be described.

Figure 13:
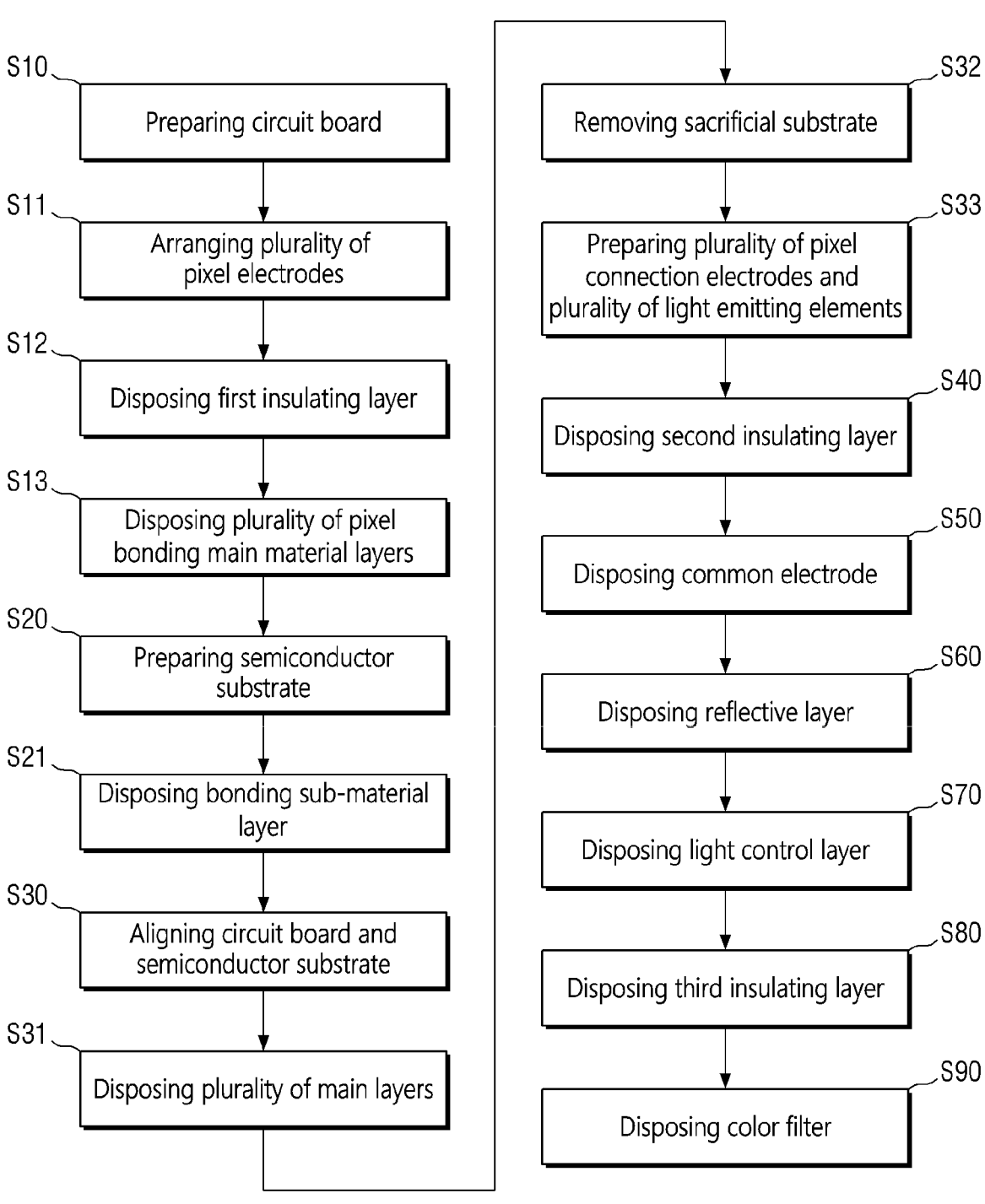
FIG. 13 is a flowchart describing a method for manufacturing the display device according to the fourth embodiment.

FIG. 13 is a flowchart describing steps of a method for manufacturing the display device according to the fourth embodiment. FIGS. 14 to 32 are process diagrams illustrating the steps described in FIG. 13.

Referring to FIG. 13, a method for manufacturing the display device 100D according to the fourth embodiment includes a step of preparing the circuit board 110 including the plurality of pixel drivers PXD respectively corresponding to the plurality of emission areas EA (step S10), a step of arranging the plurality of pixel electrodes PE respectively corresponding to the plurality of emission areas EA on the circuit board 110 (step S11), a step of respectively disposing a plurality of pixel bonding main material layers, each having a stacked structure of a first metallic material and a second metallic material having a melting point lower than that of the first metallic material on the plurality of pixel electrodes PE (step S13), a step of preparing a semiconductor substrate including a semiconductor structure disposed on one surface of a sacrificial substrate (step S20), a step of disposing a bonding sub-material layer made of the first metallic material on the semiconductor structure of the semiconductor substrate (step S21), a step of aligning the circuit board 110 and the semiconductor substrate such that the second metallic materials of the plurality of pixel bonding main material layers and the bonding sub-material layer face each other (step S30), a step of bonding the bonding sub-material layer to the plurality of pixel bonding main material layers to respectively dispose the plurality of main layers MNL, each made of an alloy of the first metallic material and the second metallic material, on the plurality of pixel electrodes PE (step S31), a step of removing the sacrificial substrate from the semiconductor structure (step S32), and a step of patterning the semiconductor structure and at least a part of the residue of the bonding sub-material layer to prepare the plurality of pixel connection electrodes PCE formed of at least a plurality of main layers and the plurality of light emitting elements LE disposed on the plurality of pixel connection electrodes PCE and respectively corresponding to the plurality of emission areas EA (step S33).

The method for manufacturing the display device 100D according to the fourth embodiment may further include, after the step S11 of arranging the plurality of pixel electrodes PE, a step of disposing the first insulating layer 121 corresponding to a separation region between the plurality of pixel electrodes PE on the circuit board 110 (step S12).

In addition, in the step S33 of preparing the plurality of pixel connection electrodes PCE and the plurality of light emitting elements LE, the barrier wall PW may be further provided to be disposed on the first insulating layer 121, corresponding to the non-emission area NEA, which is a separation region between the plurality of emission areas EA, and spaced apart from the plurality of light emitting elements LE.

The method for manufacturing the display device 100D according to the fourth embodiment may further include, after the step S33 of preparing the plurality of pixel connection electrodes PCE and the plurality of light emitting elements LE, a step of disposing the second insulating layer 122 that covers the side surface of each of the plurality of light emitting elements LE and the side surface of the barrier wall PW (step S40) and a step of disposing the common electrode CE that covers the plurality of light emitting elements LE, the barrier wall PW, the second insulating layer 122, and the first insulating layer 121 on the circuit board 110 (step S50).

The method for manufacturing the display device 100D according to the fourth embodiment may further include a step of disposing the reflective layer RFL that covers a part of the common electrode CE corresponding to the side surface of each of the plurality of light emitting elements LE and the side surface of the barrier wall PW (step S60).

The method for manufacturing the display device 100D according to the fourth embodiment may further include a step of disposing, on the common electrode CE, the light control layer LCL including the plurality of light control patterns LCP1, LCP2, and TP that are surrounded by the barrier wall PW, respectively correspond to the plurality of emission areas EA, and control the characteristics of light emitted from the plurality of light emitting elements LE (step S70), a step of disposing the third insulating layer 123 on the light control layer LCL and the common electrode CE (step S80), and a step of disposing the color filter CF on the third insulating layer 123 (step S90).

Figure 14:
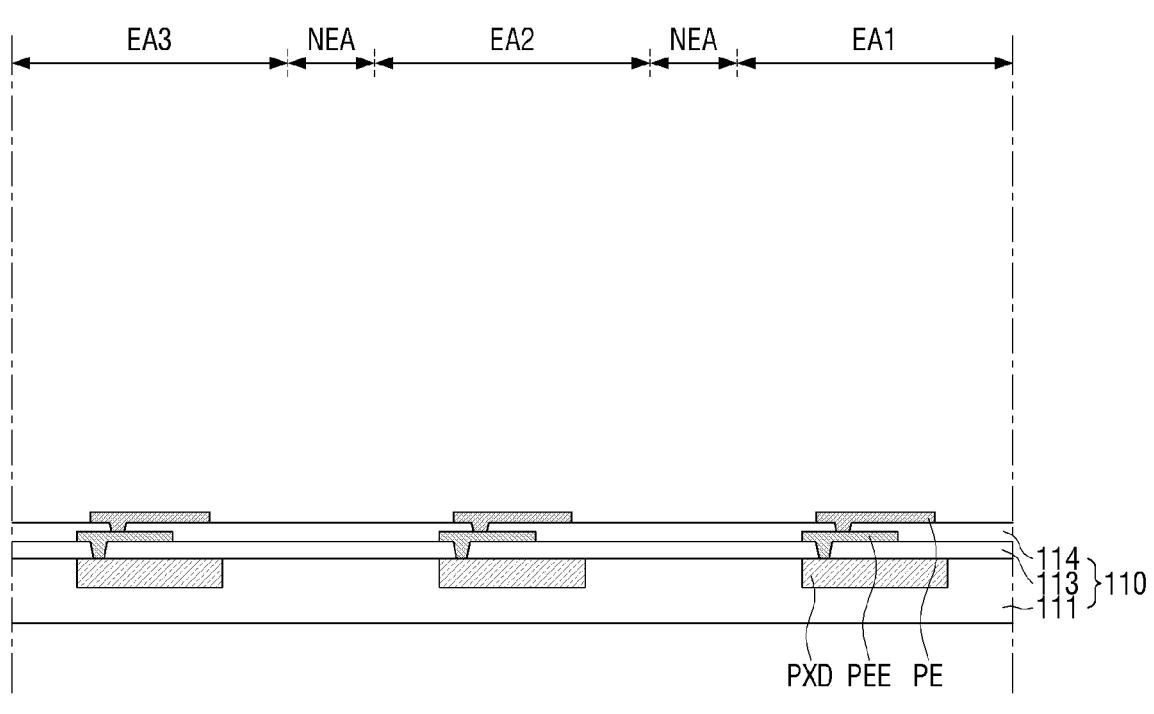
FIGS. 14 to 32 are diagrams illustrating the steps described FIG. 13.
Figure 14:
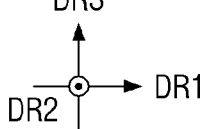

Referring to FIG. 14, in the step S10 of preparing the circuit board 110, the circuit board 110 may include the plurality of pixel drivers PXD disposed on the silicon substrate 111 to respectively correspond to the plurality of emission areas EA, the first interlayer insulating layer 113 that covers the plurality of pixel drivers PXD, the plurality of the pixel extension electrodes PEE disposed on the first interlayer insulating layer 113 to be respectively connected to the plurality of pixel drivers PXD, and the second interlayer insulating layer 114 that covers the plurality of pixel extension electrodes PEE.

As an example, the step S10 of preparing the circuit board 110 may include a step of preparing the silicon substrate 111 including the plurality of pixel drivers PXD through a semiconductor process using a silicon wafer, a step of disposing the first interlayer insulating layer 113 that covers the plurality of pixel drivers PXD, a step of disposing the plurality of pixel extension electrodes PEE, and a step of disposing the second interlayer insulating layer 114 that covers the plurality of pixel extension electrodes PEE.

Thereafter, a plurality of holes (e.g., openings) may be formed through the second interlayer insulating layer 114 and respectively corresponding to a part (or a portion) of the plurality of pixel extension electrodes PEE. Then, the plurality of pixel electrodes PE may be provided by patterning a conductive material on the second interlayer insulating layer 114 of the circuit board 110 (step S11).

The plurality of pixel electrodes PE may be disposed in a central portion of each of the plurality of emission areas EA.

Figure 15:
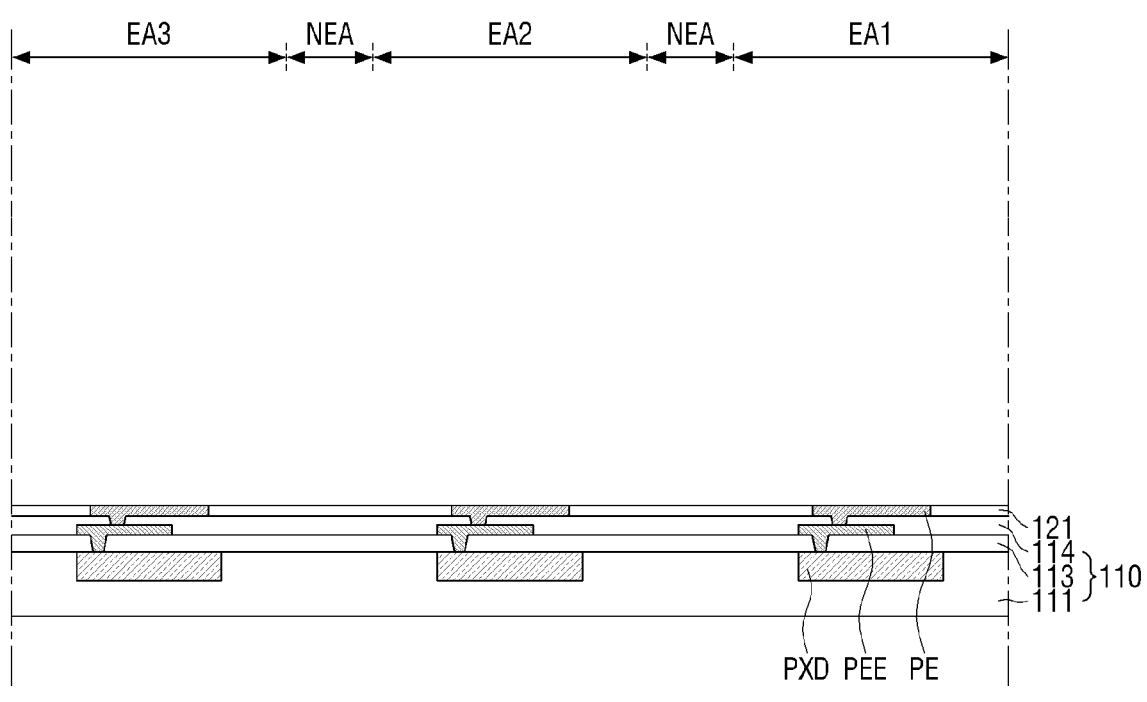
Figure 15:
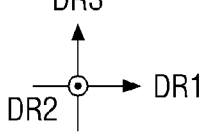

Referring to FIG. 15, the first insulating layer 121 may be formed between the plurality of pixel electrodes PE by removing a part of an insulating material applied on the circuit board 110 that covers the plurality of pixel electrodes PE (step S12).

Figure 16:
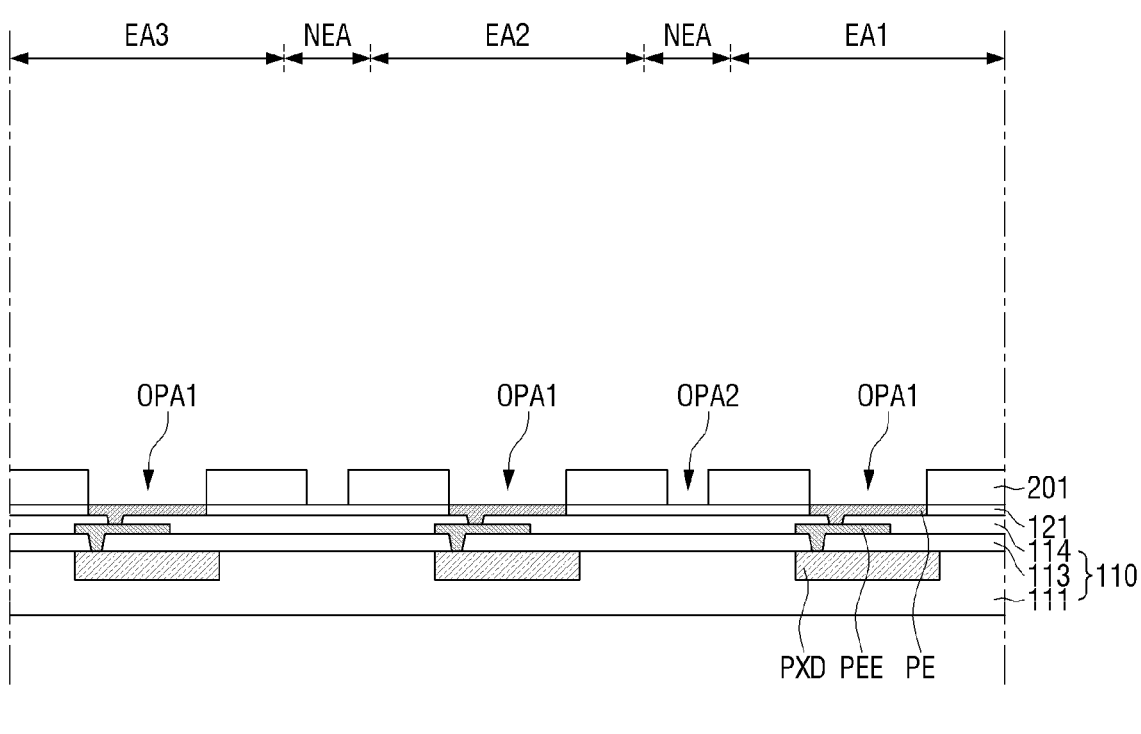
Figure 16:
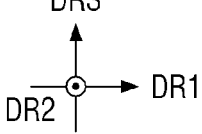
Figure 17:
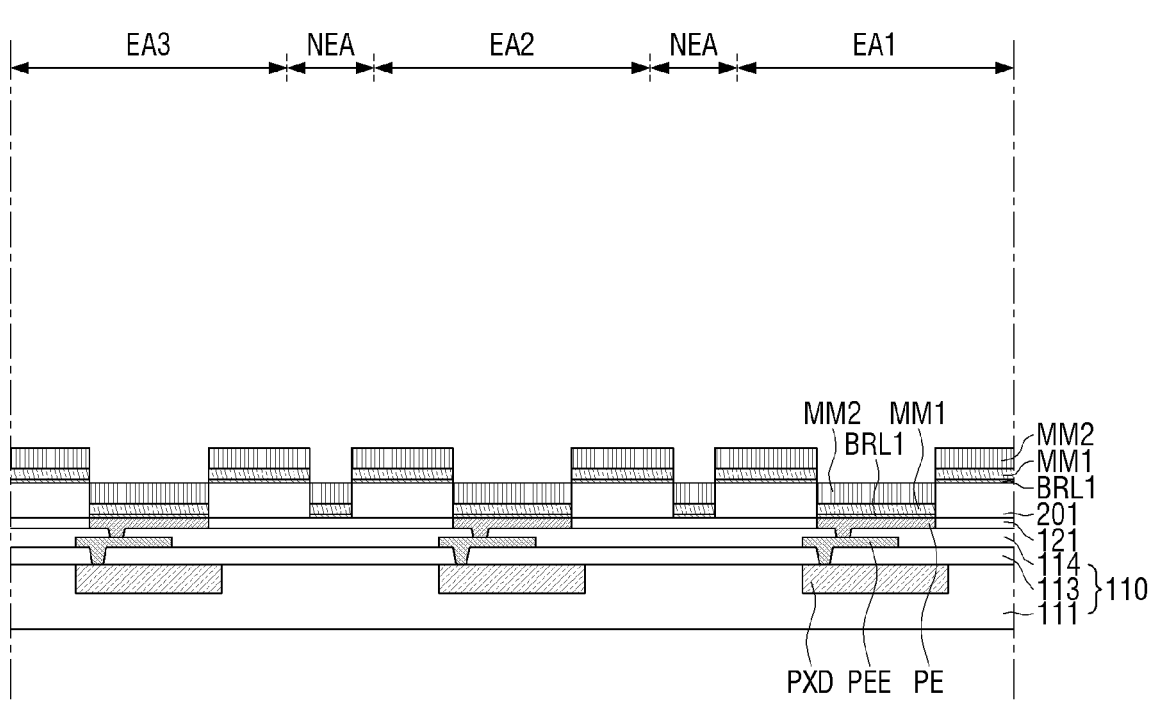
Figure 17:
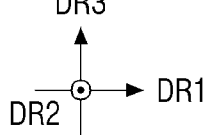
Figure 18:
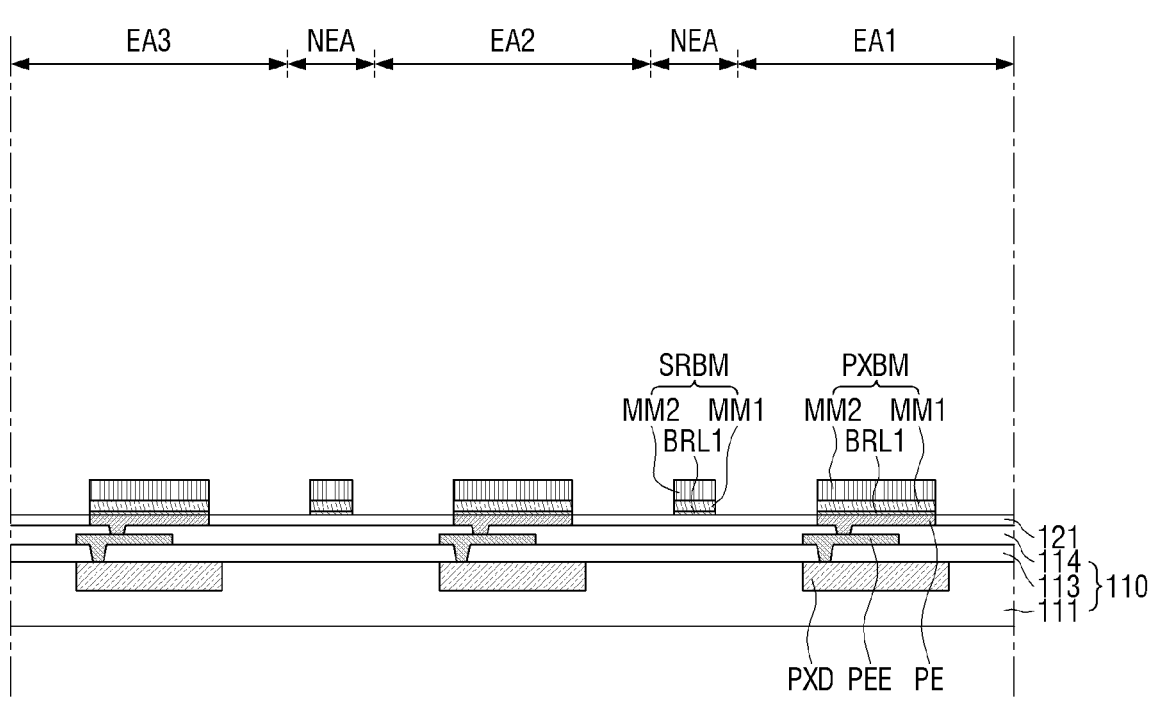
Figure 18:
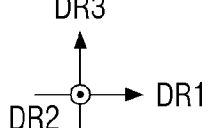

Next, referring to FIGS. 16, 17, and 18, the plurality of pixel bonding main material layers may be respectively disposed on the plurality of pixel electrodes PE in a lift-off manner (step S13).

For example, the step S13 of respectively disposing the plurality of pixel bonding main material layers on the plurality of pixel electrodes PE may include a step of disposing a mask layer 201 on a part of the first insulating layer 121 (see, e.g., FIG. 16), a step of sequentially stacking a first metallic material MM1 and a second metallic material MM2 on the plurality of pixel electrodes PE and the mask layer 201 (see, e.g., FIG. 17), and a step of separating the mask layer 201 from the first insulating layer 121 to remove the first metallic material MM1 and the second metallic material MM2 on the mask layer 201 and providing a plurality of pixel bonding main material layers PXBM, each made of the first metallic material MM1 and the second metallic material MM2 remaining on the plurality of pixel electrodes PE (see, e.g., FIG. 18).

As shown in FIG. 16, the mask layer 201 may have a plurality of first opening regions OPA1 corresponding to the plurality of pixel electrodes PE and a second opening region OPA2 corresponding to the non-emission area NEA and spaced apart from the plurality of first opening regions OPA1.

For example, the mask layer 201 may correspond to an area of the circuit board 110 excluding (other than) the plurality of first opening regions OPA1 and the second opening region OPA2.

As shown in FIG. 17, the first barrier layer BRL1 may be stacked (e.g., deposited) first before stacking the first metallic material MM1 on the plurality of pixel electrodes PE, the first insulating layer 121, and the mask layer 201.

For example, the first barrier layer BRL1, the first metallic material MM1, and the second metallic material MM2 having a melting point lower than that of the first metallic material MM1 may be sequentially stacked on the plurality of pixel electrodes PE, the first insulating layer 121, and the mask layer 201.

In the illustrated embodiment, a stacked material of the first barrier layer BRL1, the first metallic material MM1, and the second metallic material MM2 may be disposed on each of the plurality of pixel electrodes PE by (e.g., through) the plurality of first opening regions OPA1 in the mask layer 201.

Then, a stacked material of the first barrier layer BRL1, the first metallic material MM1, and the second metallic material MM2 may be disposed on a part of the first insulating layer 121 corresponding to the non-emission area NEA by (e.g., through) the second opening region OPA2 in the mask layer 201.

The first metallic material MM1 may be any one of gold (Au), silver (Ag), or copper (Cu).

The second metallic material MM2 may be Tin (Sn).

The first barrier layer BRL1 may be titanium (Ti).

As shown in FIG. 18, by separating the mask layer 201 from the first insulating layer 121, the first barrier layer BRL1, the first metallic material MM1, and the second metallic material MM2 on the mask layer 201 may be removed together with the mask layer 201.

Accordingly, the plurality of pixel bonding main material layers PXBM may be provided by the first barrier layer BRL1, the first metallic material MM1, and the second metallic material MM2 remaining on each of the plurality of pixel electrodes PE.

In addition, a peripheral bonding main material layer SRBM may be provided by the first barrier layer BRL1, the first metallic material MM1, and the second metallic material MM2 remaining on a part of the first insulating layer 121 corresponding to the non-emission area NEA.

Figure 19:
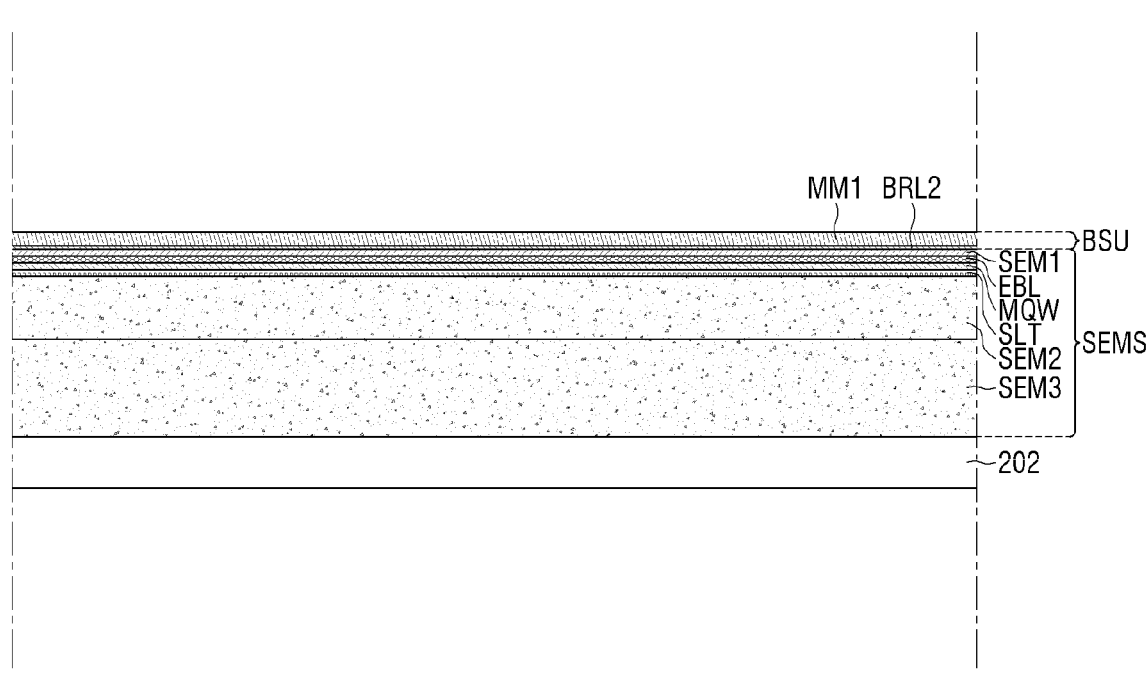

Referring to FIG. 19, the semiconductor substrate may be provided by disposing a semiconductor structure SEMS on one surface of a sacrificial substrate 202 (step S20).

The semiconductor structure SEMS may include the third semiconductor layer SEM3 disposed on one surface of the sacrificial substrate 202 and made of an undoped semiconductor material and the second semiconductor layer SEM2, the active layer MQW, and the first semiconductor layer SEM1 sequentially stacked on the third semiconductor layer SEM3.

In some embodiments, the semiconductor structure SEMS may further include the electron blocking layer EBL between the first semiconductor layer SEM1 and the active layer MQW and/or may include the superlattice layer SLT between the active layer MQW and the second semiconductor layer SEM2.

Subsequently, in a step of stacking the first metallic material MM1 on the first semiconductor layer SEM1 of the semiconductor structure SEMS, a bonding sub-material layer BSU may be disposed (step S21).

In some embodiments, the second barrier layer BRL2 may be disposed first before stacking the first metallic material MM1 on the first semiconductor layer SEM1 of the semiconductor structure SEMS.

For example, the bonding sub-material layer BSU may be provided by sequentially stacking the second barrier layer BRL2 and the first metallic material MM1 on the first semiconductor layer SEM1 of the semiconductor structure SEMS.

The second barrier layer BRL2 may be titanium (Ti).

Figure 20:
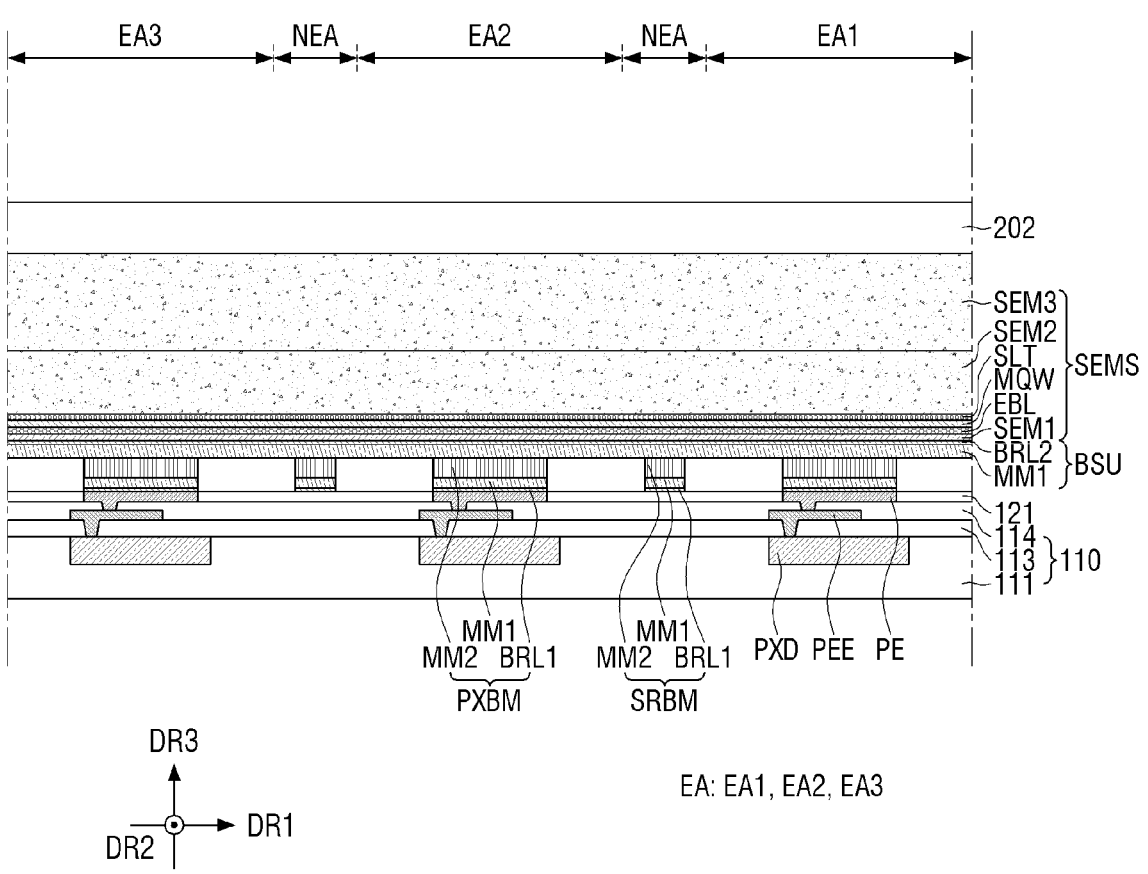

Referring to FIG. 20, the circuit board 110 and the sacrificial substrate 202, SEMS, and BSU may be aligned so that the second metallic material MM2 of each of the plurality of pixel bonding main material layers PXBM and the peripheral bonding main material layer SRBM faces the first metallic material MM1 of the bonding sub-material layer BSU (step S30).

Figure 21:
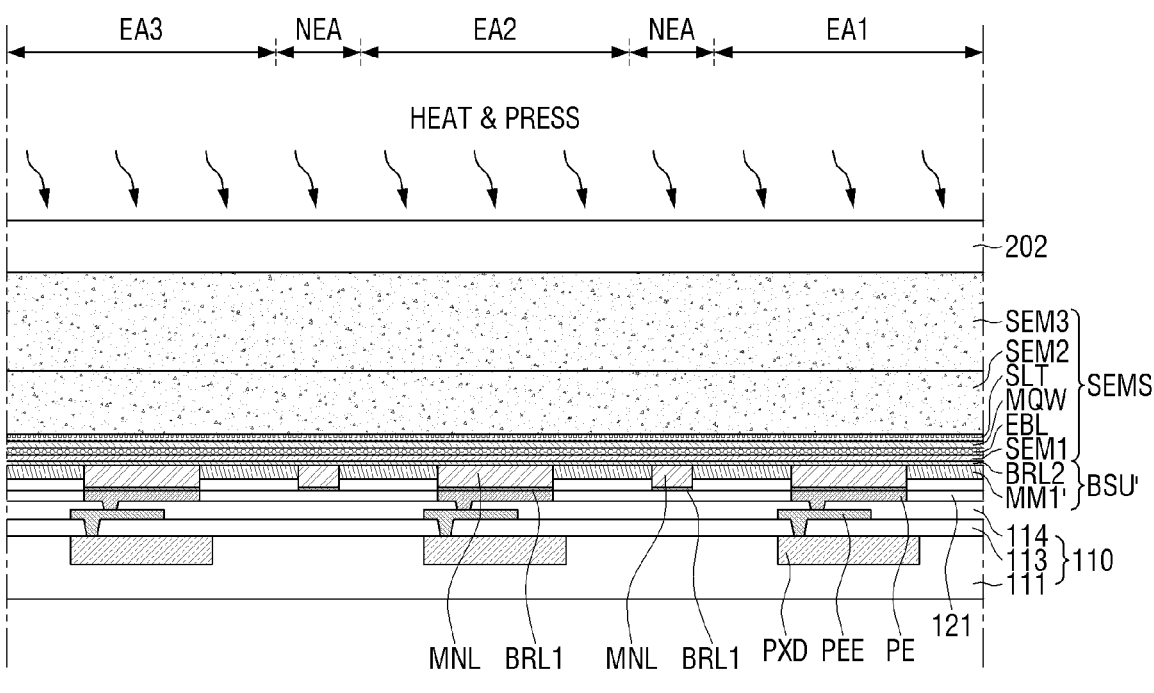
Figure 21:
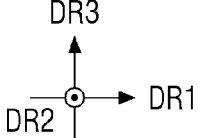

Referring to FIG. 21, the second metallic material MM2 is transformed into a molten state by a heat (e.g., by apply heat) at a temperature corresponding to or greater than the melting point of the second metallic material MM2 and applying pressure PRESS. The molten second metallic material may penetrate into the first metallic material MM1 of each of the plurality of pixel bonding main material layers PXBM, the peripheral bonding main material layer SRBM, and the bonding sub-material layer BSU, thereby implementing a coupling between the molten second metallic material and the first metallic material. Accordingly, the plurality of main layers MNL, each made of an IMC alloy of the first metallic material and the second metallic material, may be disposed on the plurality of pixel electrodes PE (step S31).

The main layer MNL may be disposed on a part of the first insulating layer 121 corresponding to the non-emission area NEA.

After the plurality of main layers MNL are disposed, in a bonding sub-material layer BSU', a part MM1' of the first metallic material not in contact with the second metallic material MM2 may remain between the main layers MNL.

Further, because each of the plurality of pixel bonding main material layers PXBM and the peripheral bonding main material layer SRBM includes the first barrier layer BRL1, the first barrier layer BRL1 may be disposed under each of the main layers MNL.

Furthermore, because the bonding sub-material layer BSU includes the second barrier layer BRL2, the second barrier layer BRL2 may be disposed on the main layers MN and the residue MM1' of the first metallic material of the bonding sub-material layer BSU'.

Figure 22:
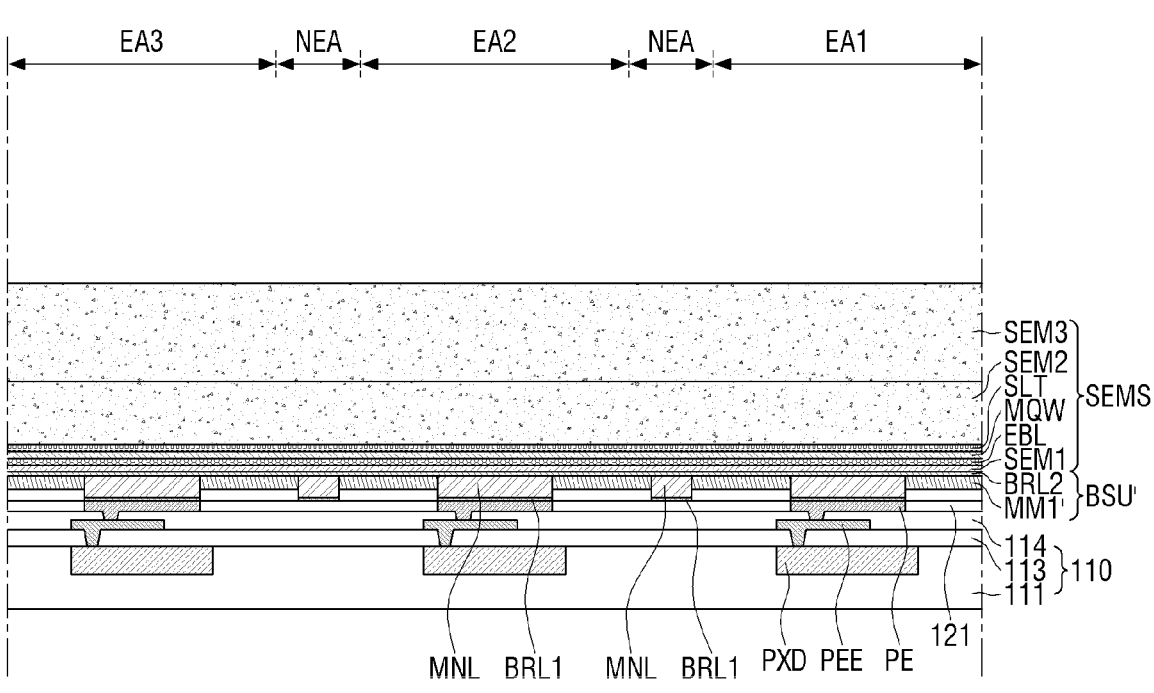
Figure 22:
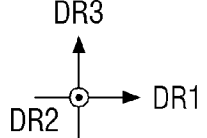

Referring to FIG. 22, the sacrificial substrate 202 is removed from the third semiconductor layer SEM3 of the semiconductor structure SEMS (step S32).

Referring to FIGS. 23, 24, 25, and 26, the plurality of light emitting elements LE, the plurality of pixel connection electrodes PCE, and the barrier wall PW may be provided by patterning the residue MM1' of the bonding sub-material layer BSU' and differentially patterning the semiconductor structure SEMS (step S33).

Figure 25:
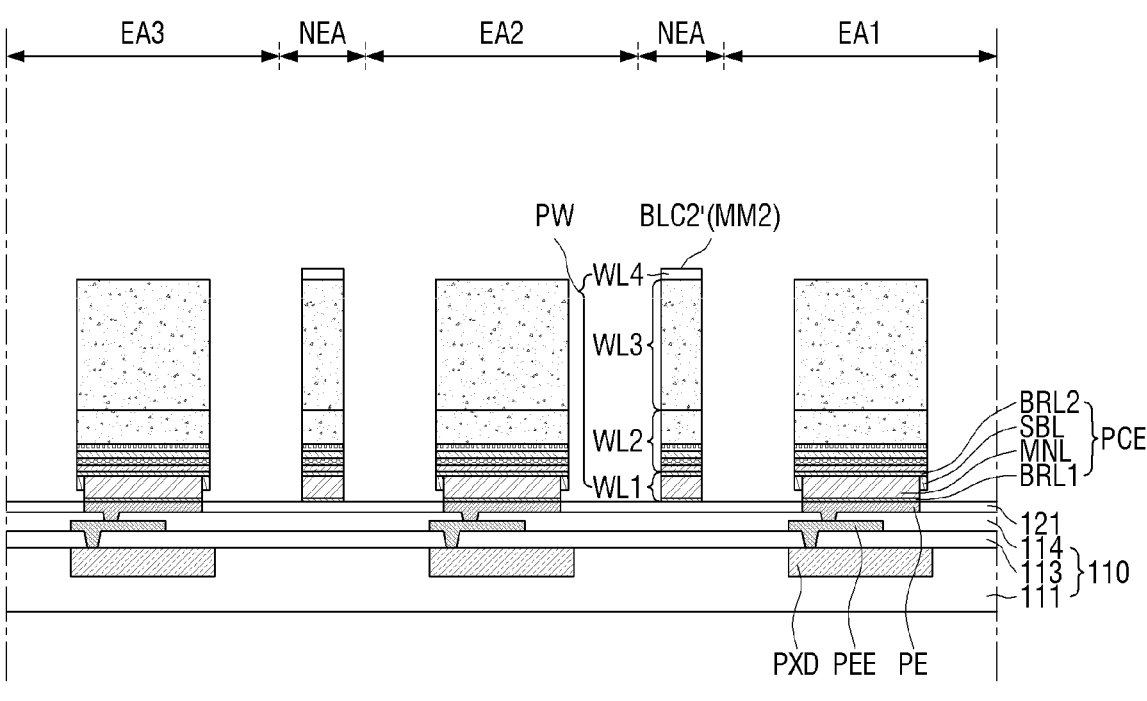
Figure 25:
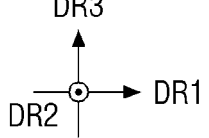
Figure 26:
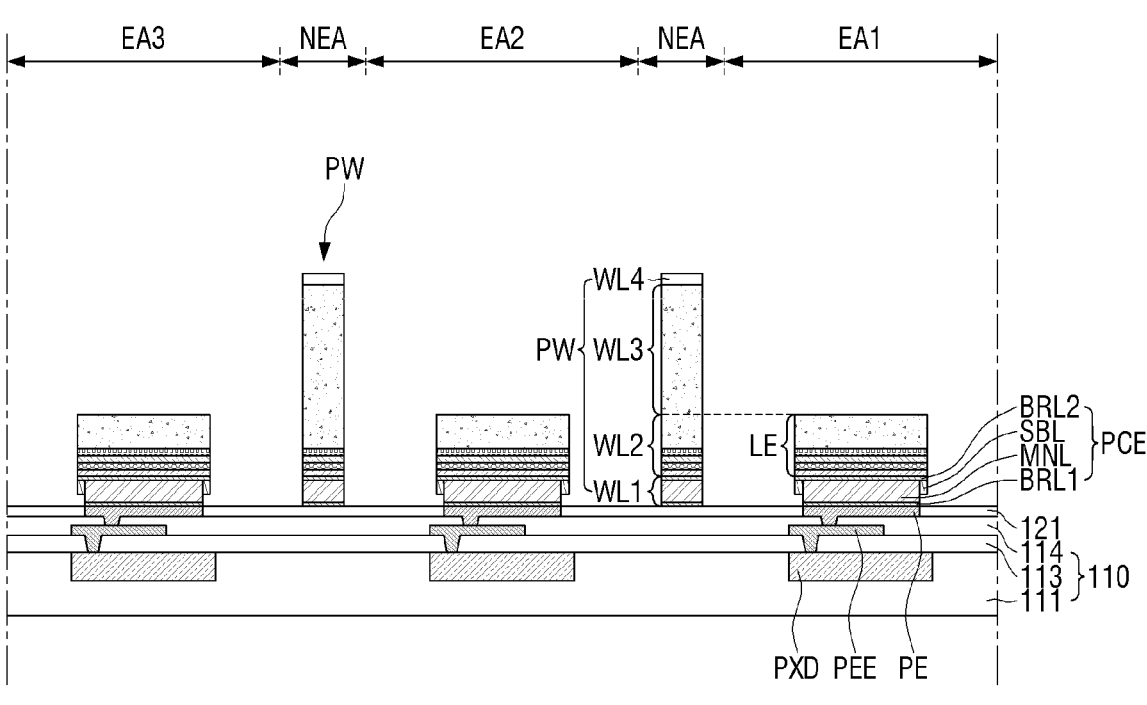
Figure 26:
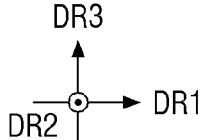

For example, the step S33 of preparing the plurality of light emitting elements LE and the plurality of pixel connection electrodes PCE may include a step of disposing a mask structure MST on the third semiconductor layer SEM3 (see FIG. 23), a step of providing a plurality of pattern layers, the plurality of pixel connection electrodes PCE, the second wall layer WL2, and the third wall layer WL3 based on (e.g., at) openings OP in the mask structure MST (see FIG. 24), a step of providing the fourth wall layer WL4 (see FIG. 25), and a step of providing the plurality of light emitting elements LE (see FIG. 26).

Figure 23:
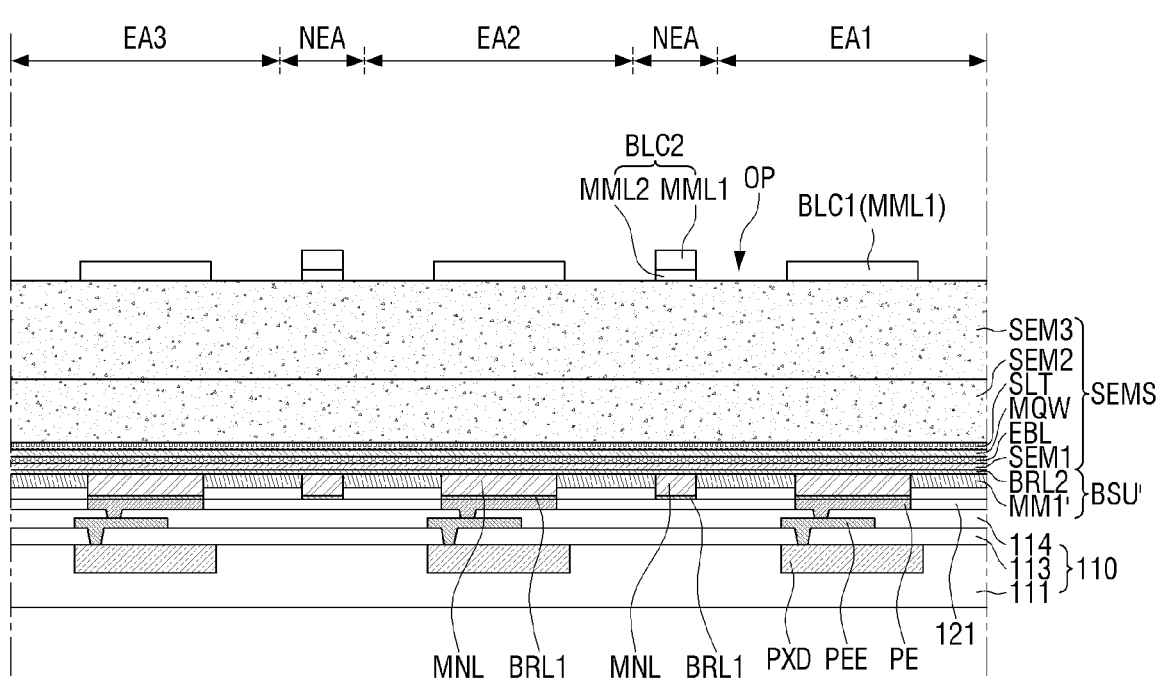
Figure 23:
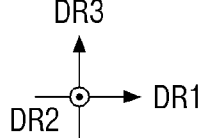

As shown in FIG. 23, the mask structure MST includes a plurality of first blocking portions BLC1 corresponding to the plurality of emission areas EA and a second blocking portion BLC2 corresponding to the non-emission area NEA with an opening OP disposed between each of the plurality of first blocking portions BLC1 and the second blocking portion BLC2.

Each of the plurality of first blocking portions BLC1 may include a first mask material layer MML1 disposed on the third semiconductor layer SEM3.

The second blocking portion BLC2 may include a second mask material layer MML2 disposed on the third semiconductor layer SEM3 and made of a material different from that of the first mask material layer MML1, and the first mask material layer MML1 disposed on the second mask material layer MML2. For example, the second blocking portion BLC2 may have a stacked structure of the second mask material layer MML2 and the first mask material layer MML1.

Figure 24:
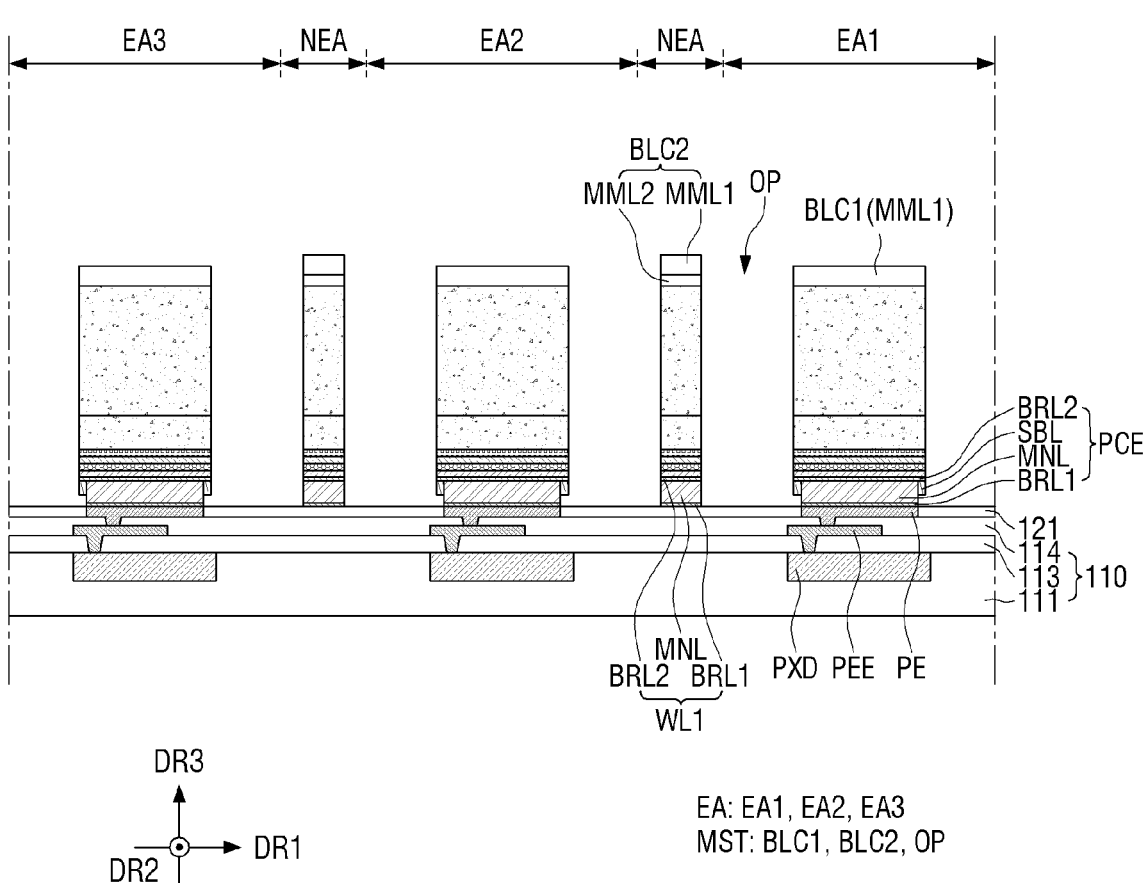

As shown in FIG. 24, a part (or portion) of each of the residue MM1' (shown in FIG. 23) of the bonding sub-material layer BSU' (shown in FIG. 23) and the semiconductor structure SEMS corresponding to the opening OP in the mask structure MST is removed. Thus, a part of the second barrier layer BRL2 corresponding to the opening OP in the mask structure MST may also be removed.

Accordingly, a plurality of pattern layers, each formed of the semiconductor structure SEMS corresponding to the plurality of first blocking portions BLC1 and the plurality of pixel connection electrodes PCE disposed under the plurality of pattern layers, may be provided. In addition, the second wall layer WL2 and the third wall layer WL3 formed of the semiconductor structure SEMS corresponding to the second blocking portion BLC2 may be provided.

Each of the plurality of pixel connection electrodes PCE may include the main layer MNL made of an IMC alloy, the sub-layer SBL surrounding a part of the upper side surface of the main layer MNL, the first barrier layer BRL1, and the second barrier layer BRL2.

In addition, the second wall layer WL2 may include the first semiconductor layer SEM1, the electron blocking layer EBL, the active layer MQW, the superlattice layer SLT, and the second semiconductor layer SEM2 sequentially stacked on the first wall layer WL1. In some embodiments, the second wall layer WL2 may further include a part of the third semiconductor layer SEM3 on the second semiconductor layer SEM2.

The third wall layer WL3 may be formed of the remaining part SEM3' of the third semiconductor layer not included in the second wall layer WL2.

As shown in FIG. 25, the plurality of pattern layers corresponding to the plurality of first blocking portions BLC1 may be exposed by removing the first mask material layer MML1, and the fourth wall layer WL4 formed of the second mask material layer MML2 of the second blocking portion BLC2 may be provided.

Accordingly, the barrier wall PW formed of the first wall layer WL1, the second wall layer WL2, the third wall layer WL3, and the fourth wall layer WL4 may be provided.

As shown in FIG. 26, at least a part of the third semiconductor layer SEM3 of each of the plurality of pattern layers corresponding to the plurality of first blocking portions BLC1 may be removed based on the second mask material layer MML2 to provide the plurality of light emitting elements LE.

Each of the plurality of light emitting elements LE may include the third semiconductor layer SEM3 having a thickness smaller than that of the barrier wall PW.

In some embodiments, each of the plurality of light emitting elements LE may not include the third semiconductor layer SEM3.

Accordingly, the plurality of pixel connection electrodes PCE, the plurality of light emitting elements LE, and barrier wall PW may be provided (step S33).

Figure 27:
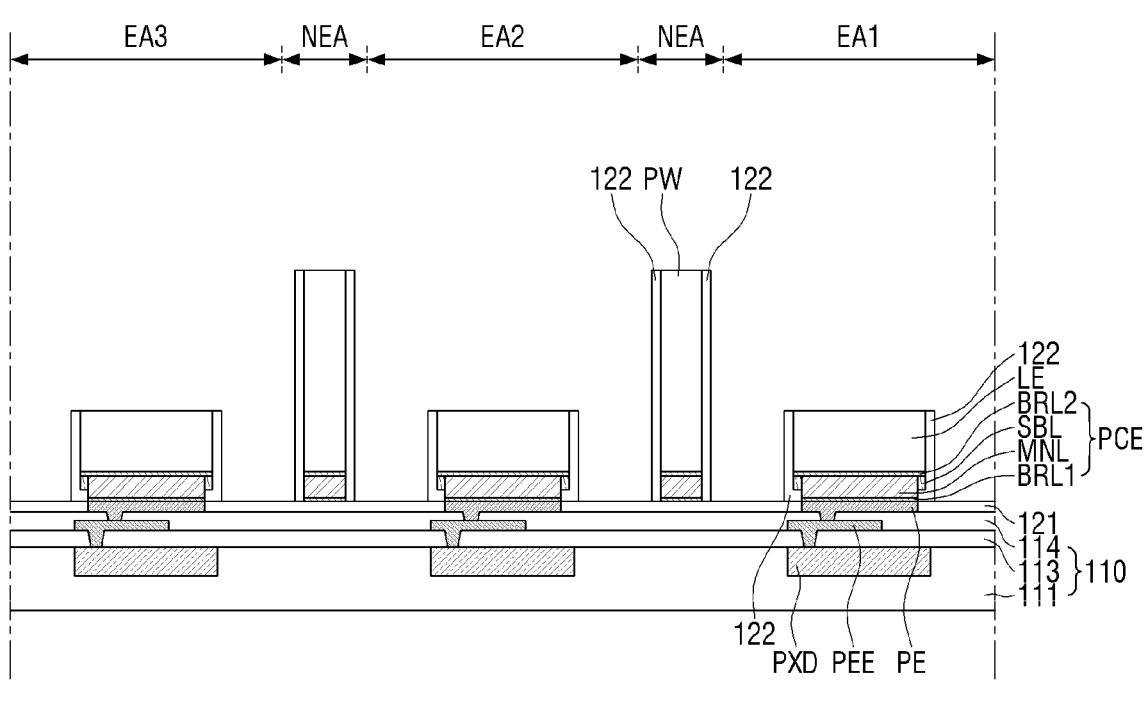
Figure 27:
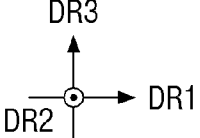

Referring to FIG. 27, the second insulating layer 122 that covers the side surface of each of the barrier wall PW and the plurality of light emitting elements LE may be provided by performing a planar ashing process on the insulating material that covers the first insulating layer 121, the plurality of light emitting elements LE, and the barrier wall PW (step S40).

Figure 28:
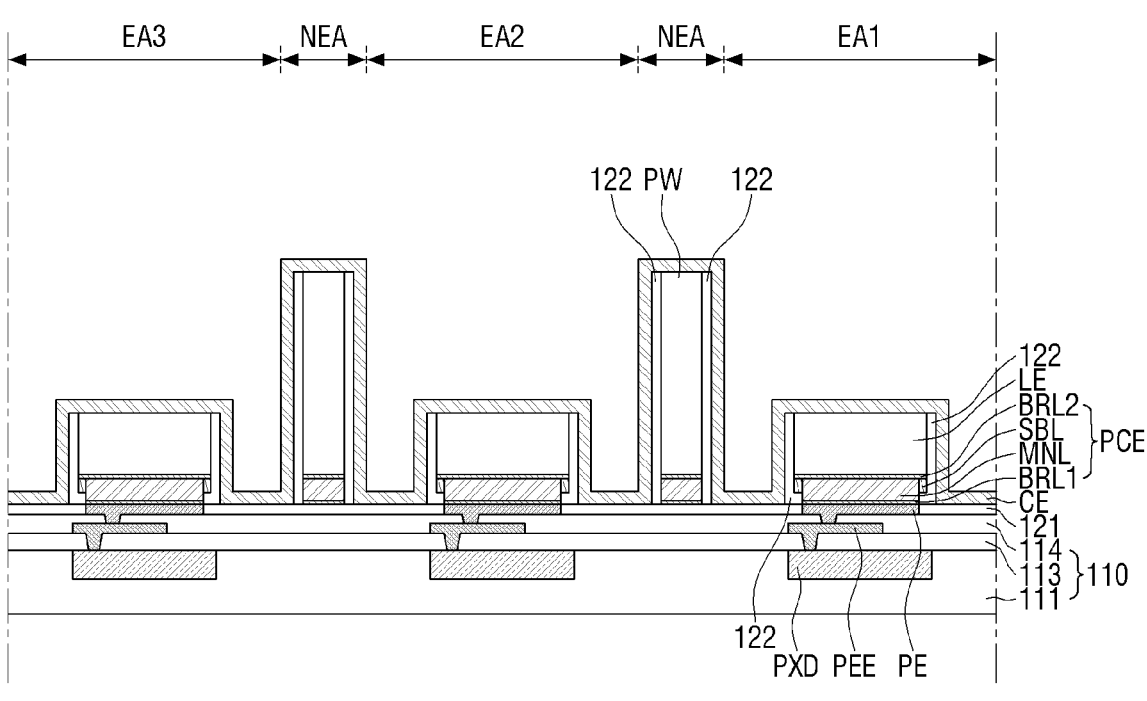
Figure 28:
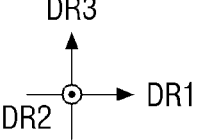

Referring to FIG. 28, the common electrode CE may be disposed by stacking a transparent conductive material on the first insulating layer 121, the second insulating layer 122, the plurality of light emitting elements LE, and the barrier wall PW (step S50).

Figure 29:
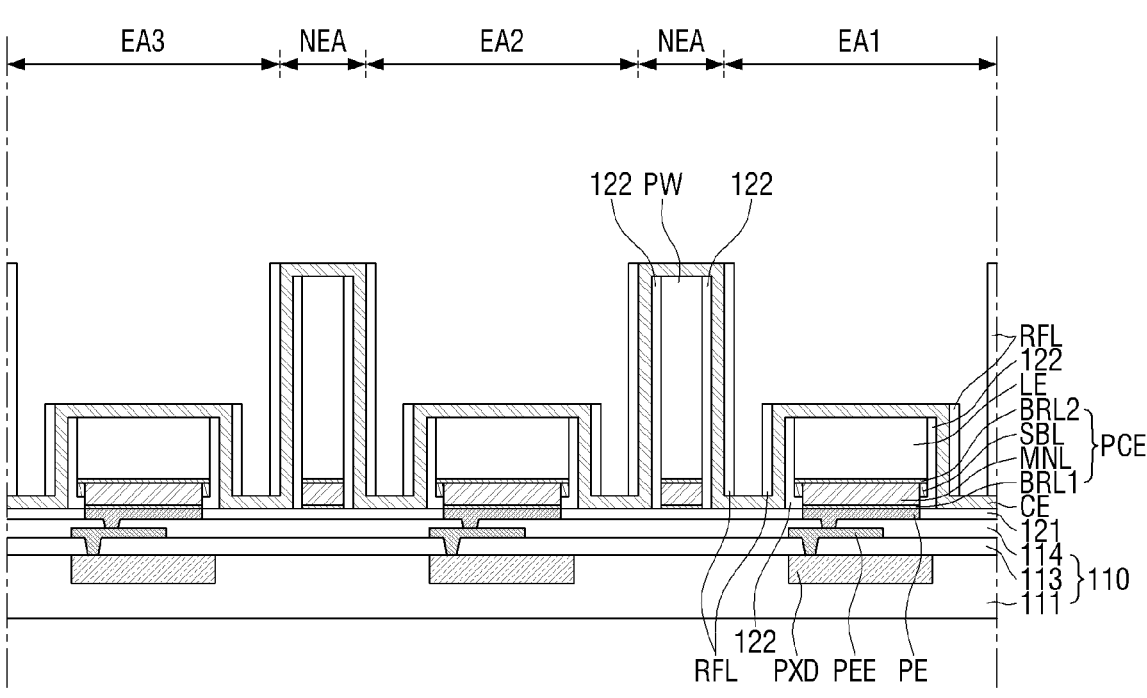
Figure 29:
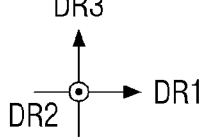

Referring to FIG. 29, the reflective layer RFL may be disposed on a part of the common electrode CE corresponding to the side surface of each of the barrier wall PW and the plurality of light emitting elements LE by performing a planar ashing process in the third direction DR3 on a reflective material that covers the common electrode CE (step S60).

Figure 30:
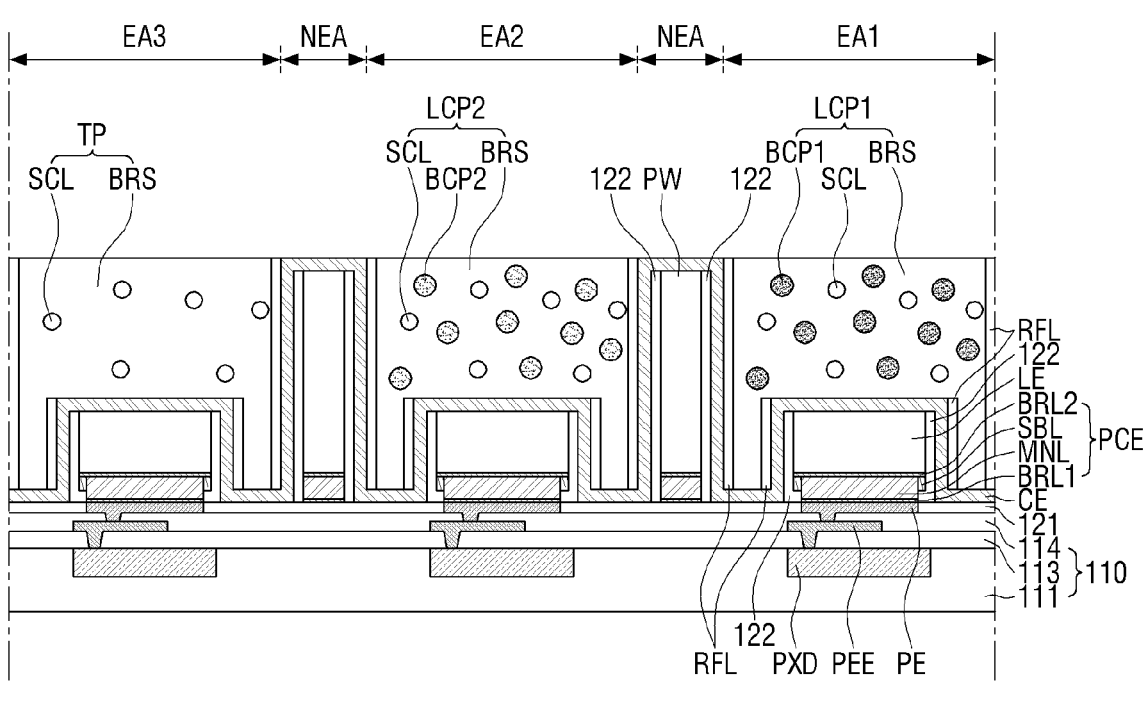
Figure 30:
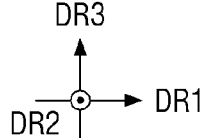

Referring to FIG. 30, the light control layer LCL including the plurality of light control patterns LCP1, LCP2, and TP respectively corresponding to regions surrounded by the barrier wall PW may be disposed (step S70).

The light control layer LCL may include the first light control pattern LCP1 corresponding to the first emission area EA1 for converting the light from the light emitting element LE into light of the wavelength band of the first color, the second light control pattern LCP2 corresponding to the second emission area EA2 for converting the light from the light emitting element LE into light of the wavelength band of the second color, and the light transmission pattern TP corresponding to the third light emission area EA3 for transmitting (e.g., scattering) light from the light emitting element LE.

The first light control pattern LCP1 of the first emission area EA1 may be formed of the base resin BRS in which the scattering particles SCL and the first wavelength conversion particles BCP1 are dispersed.

The second light control pattern LCP2 of the second emission area EA2 may be formed of the base resin BRS in which the scattering particles SCL and the second wavelength conversion particles BCP2 are dispersed.

The light transmission pattern TP of the third emission area EA3 may be formed of the base resin BRS in which scattering particles SCL are dispersed.

Figure 31:
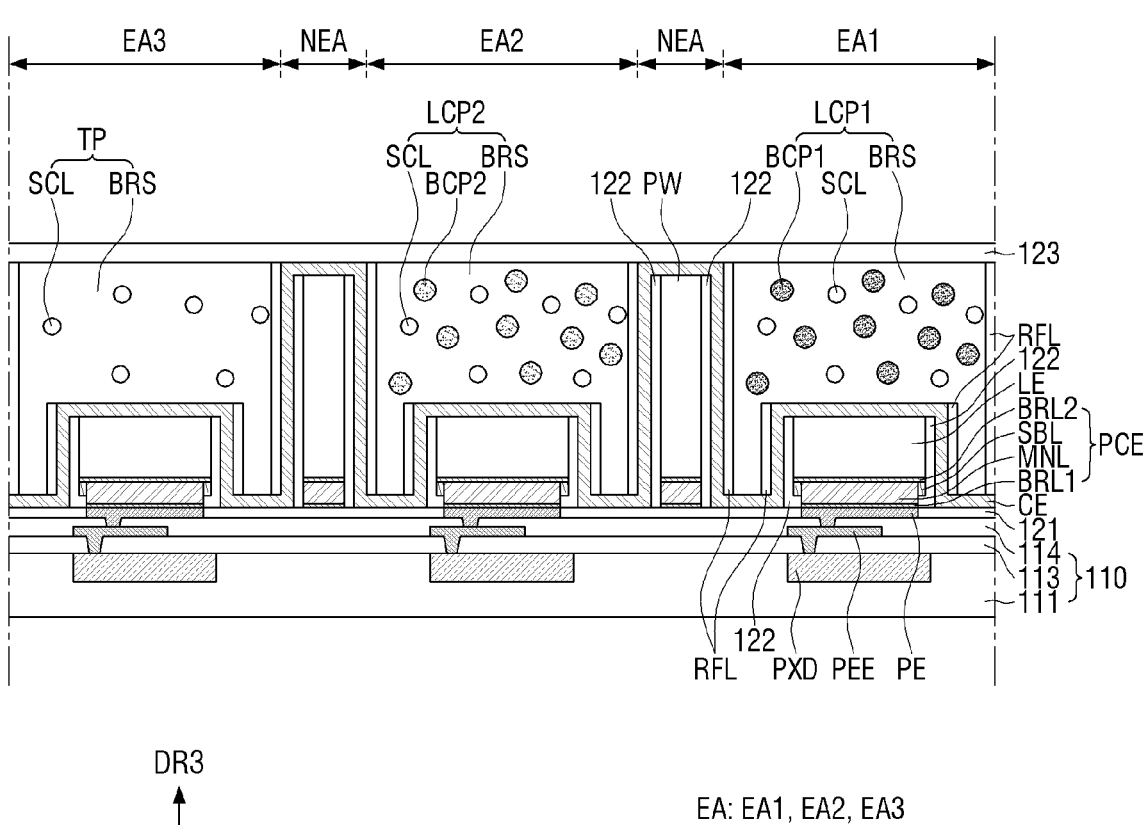

Referring to FIG. 31, the third insulating layer 123 may be disposed by stacking an insulating material on the common electrode CE and the light control layer LCL (step S80).

Figure 32:
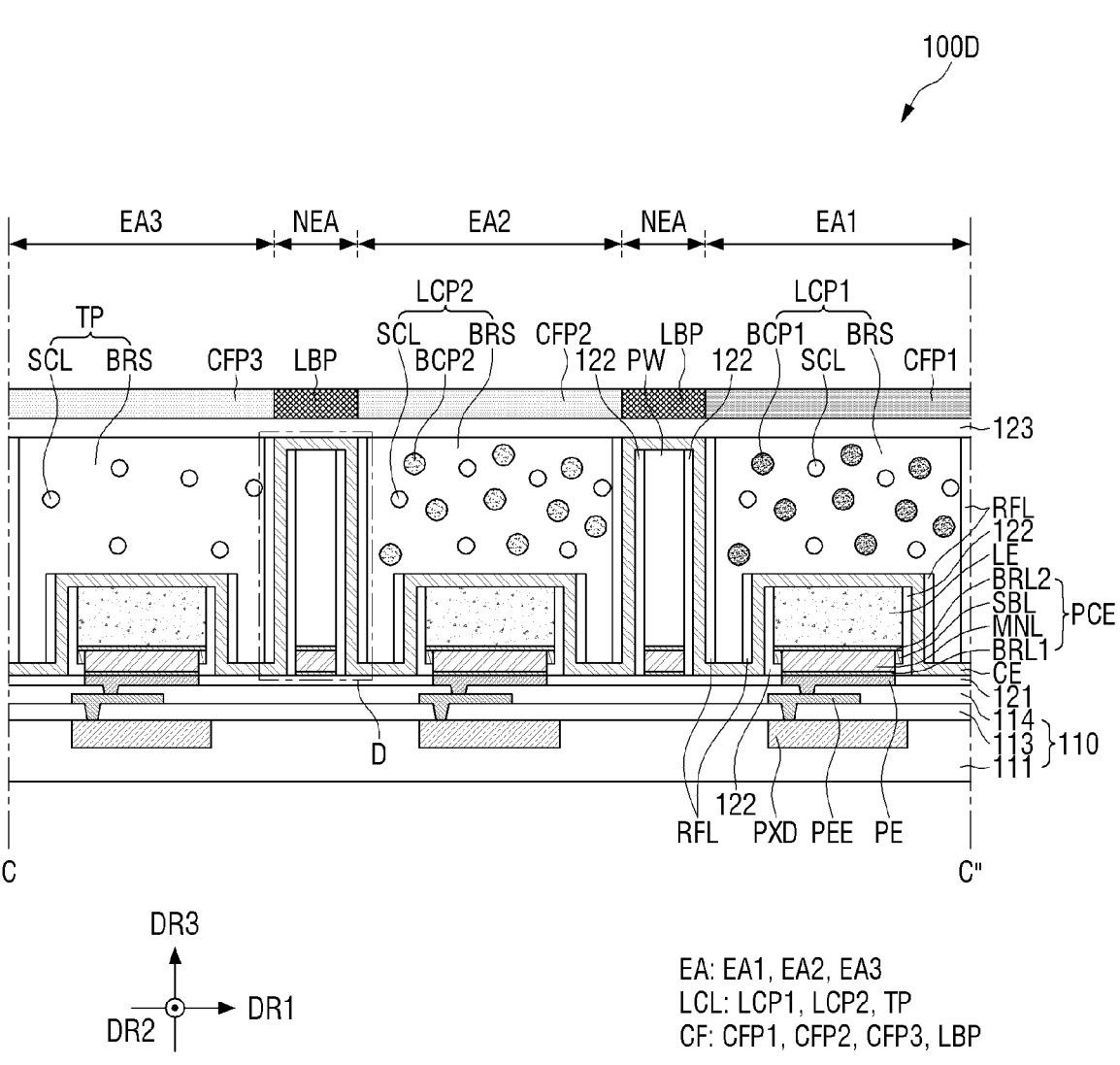

Referring to FIG. 32, the color filter CF may be disposed on the third insulating layer 123 (step S90).

The color filter CF may include the first color filter pattern CFP1 that corresponds to the first emission area EA1 and transmits light of the first color, the second color filter pattern CFP2 that corresponds to the second emission area EA2 and transmits light of the second color, the third color filter pattern CFP3 that corresponds to the third emission area EA3 and transmits light of the third color, and the light blocking pattern LBP that corresponds to the non-emission area NEA and blocks light.

Accordingly, the display device 100D according to the fourth embodiment may be manufactured.

As described above, in a method for manufacturing the display device 100D according to the fourth embodiment, the first metallic material MM1 and the second metallic material MM2 are first patterned, and then, the main layer MNL made of an IMC alloy of the first metallic material MM1 and the second metallic material MM2 is provided so that the IMC alloy does not need to be patterned (e.g., so that a step of patterning the IMC alloy may be excluded).

Accordingly, because the difficulty of the step S33 of preparing the plurality of pixel connection electrodes PCE each including the main layer MNL is reduced, yield and product reliability may be improved.

Figure 33:
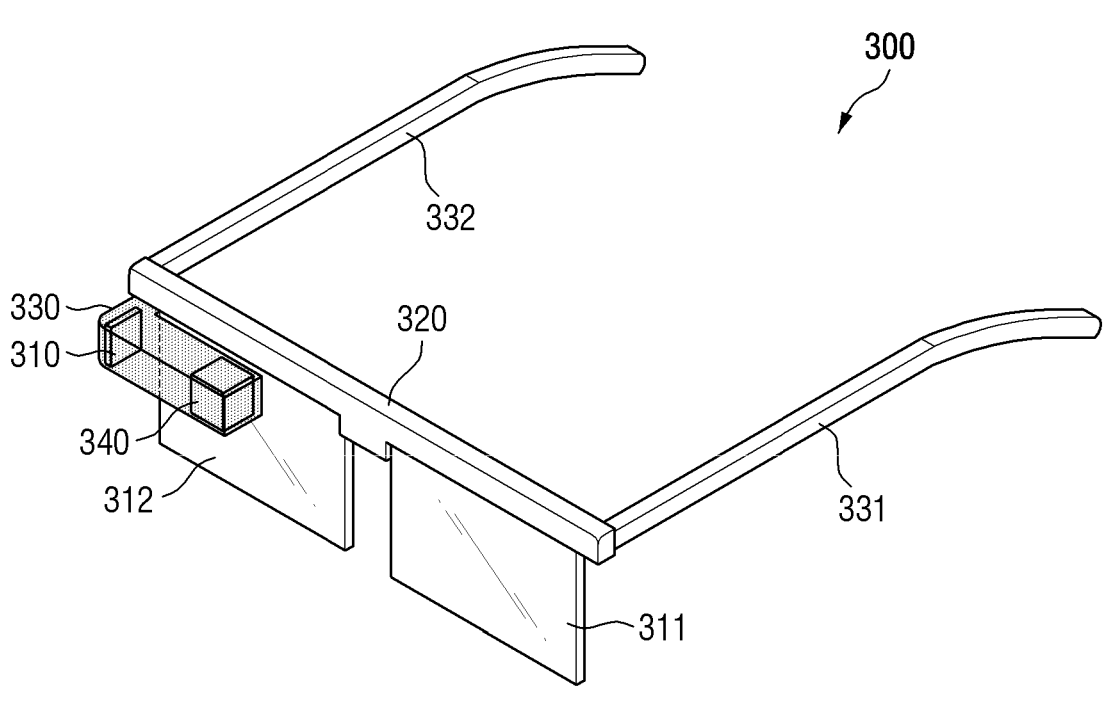
FIG. 33 is a perspective view illustrating a virtual reality device including a display device according to one embodiment.

FIG. 33 illustrates a virtual reality device including a display device according to one embodiment.

FIG. 33 illustrates a virtual reality device 30 to which a display device 310 according to one embodiment is applied.

Referring to FIG. 33, the virtual reality device 300 according to one embodiment may be a glass-type device. The virtual reality device 300 according to one embodiment may include the display device 310, a left lens 311, a right lens 312, a support frame 320, temples 331 and 332, a reflection member 340, and a display device storage.

Although FIG. 33 illustrates an embodiment of the virtual reality device 300 including the temples 331 and 332, the virtual reality device 300 according to other embodiments may be applied to a head mounted display including a head mounted band that may be worn on a head instead of the temples 331 and 332. For example, the virtual reality device 300 is not limited to that shown in FIG. 33 and may be applied in various forms to various electronic devices.

The display device storage may include the display device 310 and the reflection member 340. The image displayed on the display device 310 may be reflected by the reflection member 340 and provided to a user's right eye through the right lens 312. Accordingly, the user can view the virtual reality image displayed on the display device 310 through the right eye.

FIG. 33 illustrates that the display device storage is disposed at the end of the right side of a support frame 320, but the present specification is not limited thereto. For example, the display device storage may be disposed at the left end of the support frame 320, and in such an embodiment, the image displayed on the display device 310 may be reflected by the reflection member 340 and provided to a user's left eye through the left lens 311. Accordingly, the user can view the virtual reality image displayed on the display device 310 through the left eye. In another embodiment, the display device storage may be disposed at both the left end and the right end of the support frame 320. In such an embodiment, the user can view the virtual reality image displayed on the display device 310 through both the left eye and the right eye.

Figure 34:
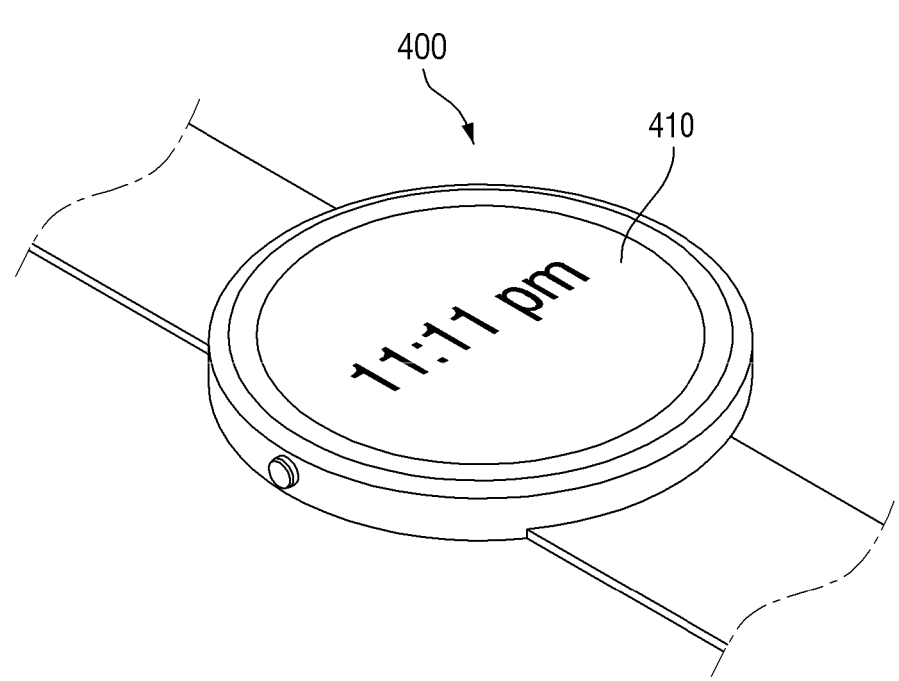
FIG. 34 is a perspective view illustrating a smart device including a display device according to one embodiment.

FIG. 34 illustrates a smart device including a display device according to one embodiment.

Referring to FIG. 34, a display device 410 according to one embodiment may be applied to a smart watch 400, which is one of the smart devices.

Figure 35:
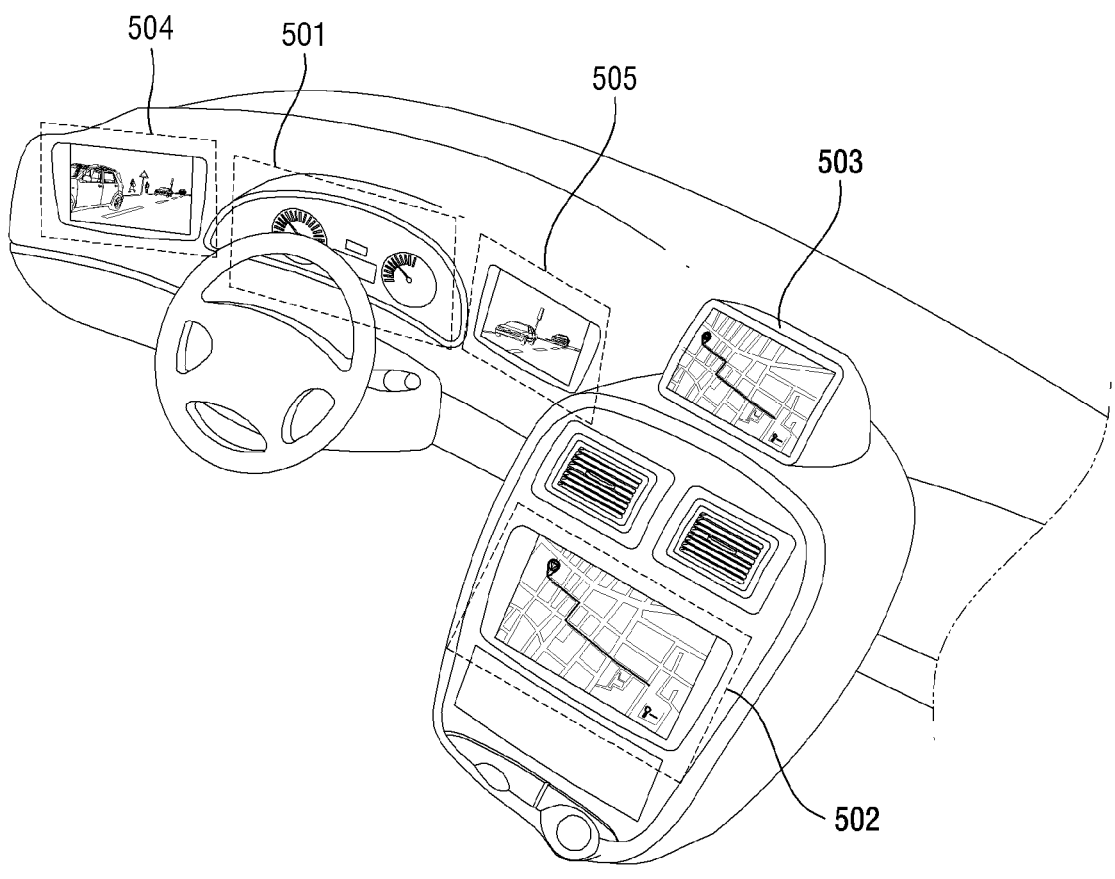
FIG. 35 is a view illustrating a dashboard of an automobile and a center fascia including display devices according to one embodiment.

FIG. 35 illustrates a dashboard of an automobile and a center fascia including display devices according to one embodiment.

FIG. 35 illustrates a vehicle to which display devices 501, 502, 503, 504, and 505 according to one embodiment are applied.

Referring to FIG. 35, the display devices 501, 502, and 503 according to one embodiment may be applied to the dashboard of the automobile, the center fascia of the automobile, and/or the center information display (CID) of the dashboard of the automobile. Further, the display devices 504 and 505 according to one embodiment may be applied to a room mirror display instead of side mirrors of the automobile.

Figure 36:
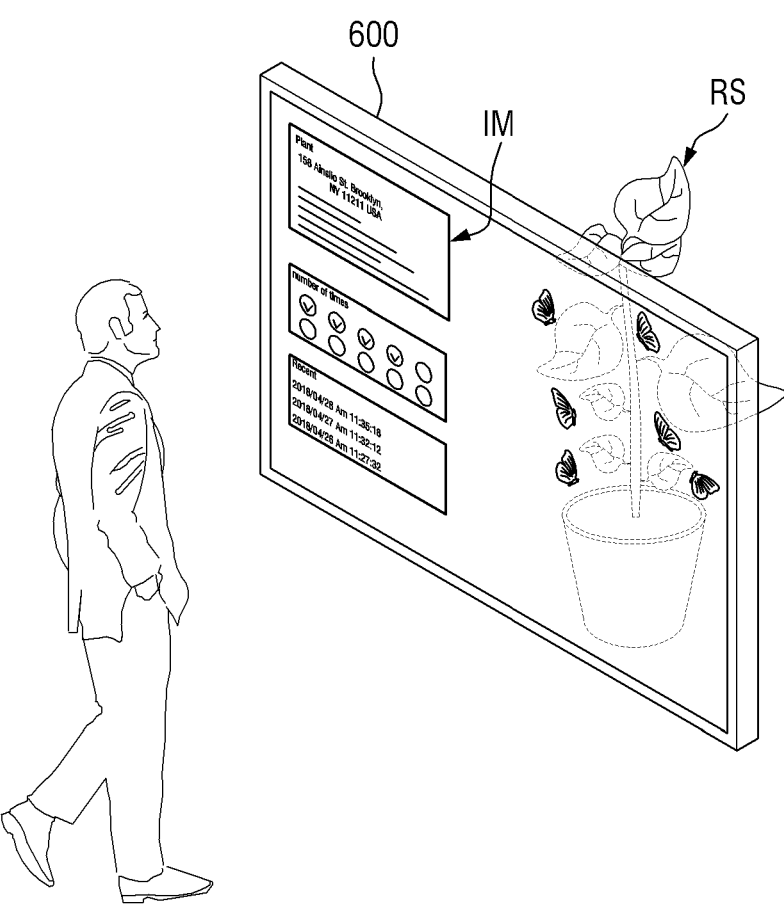
FIG. 36 is a perspective view illustrating a transparent display device including a display device according to one embodiment.

FIG. 36 illustrates a transparent display device including a display device according to one embodiment.

Referring to FIG. 36, a display device 600 according to one embodiment may be applied to the transparent display device. The transparent display device may display an image IM and may also transmit light. Thus, a user located at the front side of the transparent display device can view an object RS or a background at the rear side of the transparent display device as well as the image IM displayed on the display device 600. When the display device 600 is applied to the transparent display device, the circuit board (see, e.g., '110' in FIGS. 7, 9, 10, and 11) may include a light transmitting portion for (or configured for) transmitting light or may be made of a material configured to transmit light (e.g., a light transmissive material).

However, aspects and features of the present disclosure are not limited to those set forth herein. The above and other aspects and features of the present disclosure will become more apparent to one of ordinary skill in the art to which the disclosure pertains by referencing the claims, with equivalents thereof to be included therein.

What is claimed is:

1. A display device comprising:
a circuit board comprising a plurality of pixel drivers respectively corresponding to a plurality of emission areas;
a plurality of pixel electrodes on the circuit board and respectively corresponding to the plurality of emission areas;
a plurality of pixel connection electrodes respectively on the plurality of pixel electrodes, each of the plurality of pixel connection electrodes comprising:
a main layer on each of the plurality of pixel electrodes; and
a sub-layer surrounding a part of a side surface of the main layer adjacent to a top surface of the main layer and comprising a material different from a material of the main layer; and
a plurality of light emitting elements respectively on the plurality of pixel connection electrodes.

2. The display device of claim 1, wherein one of the pixel connection electrodes from among the plurality of pixel connection electrodes is between one of the pixel electrodes from among the plurality of pixel electrodes and one of the light emitting elements from among the plurality of light emitting elements,
wherein a width of the main layer of the pixel connection electrode corresponds to a width of the pixel electrode, and
wherein a width of the sub-layer of the pixel connection electrode corresponds to a width of the light emitting element.

3. The display device of claim 2, wherein the width of the light emitting element is greater than the width of the pixel electrode.

4. The display device of claim 1, wherein the main layer comprises an alloy of a first metallic material and a second metallic material,
wherein the second metallic material has a lower melting point than the first metallic material, and
wherein the sub-layer comprises the first metallic material.

5. The display device of claim 4, wherein the first metallic material is one of gold (Au), silver (Ag), and copper (Cu), and
wherein the second metallic material is tin (Sn).

6. The display device of claim 1, wherein each of the plurality of pixel connection electrodes further comprises:
a first barrier layer between the main layer and each of the plurality of pixel electrodes; and
a second barrier layer between the main layer and the sub-layer.

7. The display device of claim 6, wherein each of the first barrier layer and the second barrier layer comprises titanium (Ti).

8. The display device of claim 1, wherein the circuit board comprises:

a first interlayer insulating layer covering the plurality of
pixel drivers;

a plurality of pixel extension electrodes on the first
interlayer insulating layer and electrically connected to
the plurality of pixel drivers, respectively; and a second interlayer insulating layer covering the plurality
of pixel extension electrodes, wherein the plurality of pixel electrodes is on the second
interlayer insulating layer, and wherein the plurality of pixel electrodes is electrically
connected to the plurality of pixel extension electrodes,
respectively.

9. The display device of claim 1, further comprising:

a first insulating layer on the circuit board and corre-
sponding to a separation region between the plurality of
pixel electrodes;

a barrier wall on the first insulating layer and correspond-
ing to a non-emission area, the non-emission area being
a separation region between the plurality of emission
areas, the barrier wall spaced apart from the plurality of
light emitting elements;

a second insulating layer covering a side surface of each
of the plurality of light emitting elements and a side
surface of the barrier wall; and a common electrode on the circuit board and covering the
plurality of light emitting elements, the barrier wall,
and the second insulating layer.

10. The display device of claim 9, further comprising a
reflective layer covering a part of the common electrode
corresponding to the side surface of each of the plurality of
light emitting elements and the side surface of the barrier
wall.

11. The display device of claim 9, further comprising:

a light control layer on the common electrode and com-
prising a plurality of light control patterns, each of the
plurality of light control patterns being surrounded by
the barrier wall, corresponding to each of the plurality
of emission areas, and configured to change a charac-
teristic of light emitted from each of the plurality of
light emitting elements;

a third insulating layer on the light control layer and the
common electrode; and a color filter on the third insulating layer.

12. The display device of claim 9, wherein the barrier wall
comprises:

a first wall layer on the first insulating layer and being the
same layer as the plurality of pixel connection elec-
trodes;

a second wall layer on the first wall layer and being the
same layer as the plurality of light emitting elements;

a third wall layer on the second wall layer and comprising
a semiconductor material; and a fourth wall layer on the third wall layer and comprising
a mask material.

* * * * *